US012108575B1

United States Patent
Hernandez Franco et al.

(10) Patent No.: US 12,108,575 B1
(45) Date of Patent: Oct. 1, 2024

(54) REGULATING TEMPERATURE OF AN IMAGE SENSOR USING A THERMOELECTRIC COOLER

(71) Applicant: GHOST AUTONOMY INC., Mountain View, CA (US)

(72) Inventors: Efrain Hernandez Franco, Mountain View, CA (US); Riaz Ali, Mountain View, CA (US); Arpita Ghosh Dastidar, Mountain View, CA (US); Mickee Pun, Sunnyvale, CA (US); Shaun M. Pacheco, Santa Clara, CA (US)

(73) Assignee: GHOST AUTONOMY INC., Mountain View, CA (US)

( * ) Notice: Subject to any disclaimer, the term of this patent is extended or adjusted under 35 U.S.C. 154(b) by 205 days.

(21) Appl. No.: 17/931,348

(22) Filed: Sep. 12, 2022

(51) Int. Cl.
*G06F 1/16* (2006.01)
*H04N 23/52* (2023.01)
*H05K 5/00* (2006.01)
*H05K 7/00* (2006.01)
*H05K 7/20* (2006.01)

(52) U.S. Cl.
CPC ......... *H05K 7/20409* (2013.01); *H04N 23/52* (2023.01); *H05K 7/20172* (2013.01)

(58) Field of Classification Search
CPC ........ H04N 23/52; H04N 23/51; H04N 23/50; H04N 23/55; H05K 7/20409; H05K 7/20418; H05K 7/20427; H05K 7/20172; H05K 7/20436; H05K 7/2039; H05K 7/20136; H05K 7/20009
See application file for complete search history.

(56) References Cited

U.S. PATENT DOCUMENTS

| | | | | |
|---|---|---|---|---|
| 4,295,721 A | * | 10/1981 | Rebikoff | H04N 23/51 396/26 |
| 10,298,817 B1 | * | 5/2019 | Schlupf | H04N 23/52 |
| 10,589,723 B1 | * | 3/2020 | Dubey | G01S 7/497 |
| 2009/0284644 A1 | * | 11/2009 | McKaughan | H04N 23/90 348/E5.045 |

(Continued)

OTHER PUBLICATIONS

Dereka, "Active Cooling Expands Design Options for Thermal Cameras", photonics.com (online), [accessed Aug. 8, 2022], 11 pages, URL: https://www.photonics.com/Articles/Active_Cooling_Expands_Design_Options_for_Thermal/a67636.

(Continued)

*Primary Examiner* — Anthony M Haughton

(57) ABSTRACT

A system includes a camera module having an image sensor configured to capture image data and a thermal plate thermally coupled to the image sensor. A first temperature sensor is configured to capture a temperature of the image sensor. A thermoelectric cooler is included in the camera module, with a cold side of the thermoelectric cooler coupled to the thermal plate and a hot side of the thermoelectric cooler thermally coupled to a heat sink. A controller is coupled to the thermoelectric cooler and to the first temperature sensor. The controller is configured to generate a control signal in response to a comparison of the temperature of the image sensor to a stored temperature for the image sensor. The control signal adjusts transfer of heat between the cold side of the thermoelectric cooler and the hot side of the thermoelectric cooler.

41 Claims, 12 Drawing Sheets

(56) References Cited

U.S. PATENT DOCUMENTS

| | | | | |
|---|---|---|---|---|
| 2013/0139524 A1* | 6/2013 | Kim | ........................ | F25B 21/02 62/3.7 |
| 2014/0132804 A1* | 5/2014 | Guissin | ............ | G08B 13/19645 348/239 |
| 2015/0350569 A1* | 12/2015 | Espersen | ................ | H04N 23/45 348/164 |
| 2018/0007248 A1* | 1/2018 | Zeise | ...................... | B64U 20/87 |
| 2019/0306966 A1* | 10/2019 | Byrne | .................... | G02B 7/028 |
| 2021/0021747 A1* | 1/2021 | Brzobohaty | ............ | H04N 23/54 |
| 2021/0400179 A1* | 12/2021 | Brown | ................... | G03B 17/55 |
| 2023/0011457 A1* | 1/2023 | Lu | ........................ | H01S 5/02415 |

OTHER PUBLICATIONS

Hamamatsu, "CCD area image sensors", S7033/S7034 series, hamammatsu.com (online), [accessed Aug. 8, 2022], 12 pages, URL: https://www.hamamatsu.com/content/dam/hamamatsu-photonics/sites/documents/99_SALES_LIBRARY/ssd/s7033-0907_etc_kmpd1029e.pdf.

Laird Thermal Systems, "Thermoelectric Cooling for Security Cameras", Laird Thermal Systems Application Note, 2020 (month unknown), 8 pages, Brainard-Nielsen Marketing (online), [accessed Jun. 8, 2022], URL: https://onmsales.com/wp-content/uploads/2020/10/Thermoelectric-Cooling-Security-Cameras-Appnote-101420.pdf.

Mallincam, "How It's Made", mallincam.net (online), [accessed Aug. 8, 2022], 6 pages, URL: https://www.mallincam.net/how-its-made.html.

Vision Systems, "Cmos camera line features thermoelectric cooling", vision-systems.com (online), [accessed Aug. 8, 2022], 3 pages, URL: https://www.vision-systems.com/cameras-accessories/article/14184538/scientific-cmos-cameras-with-tec-cooling-from-imperx-released.

* cited by examiner

REGULATING TEMPERATURE OF AN IMAGE SENSOR USING A THERMOELECTRIC COOLER

BACKGROUND

Field of the Invention

The field of the invention is vehicle systems or, more specifically modifying temperature of an image sensor included in an autonomous vehicle.

Description of Related Art

Image sensors capturing image data of a local area provide high image quality within a range of operating temperatures. However, as temperatures increase, image sensors experience thermal noise, losing image quality as temperature increases. For many image sensors, image resolution degrades when the image sensor temperature exceeds 60 degrees Celsius. Further, at lower temperatures, frost or ice may form on or around the image sensor, degrading captured image data. In environments having a wide range of ambient temperatures, images captured by an image sensor may have lower quality based on the ambient temperature. For example, an automotive environment may have a range of ambient temperatures from −40 degrees Celsius to 105 degrees Celsius, while conventional image sensors have a stable operating range of 0 degrees Celsius to 60 degrees Celsius, resulting in image sensors providing lower quality images for portions of the ambient temperature range.

SUMMARY

A system includes a camera module having an image sensor configured to capture image data and a thermal plate thermally coupled to the image sensor. A first temperature sensor is configured to capture a temperature of the image sensor. A thermoelectric cooler is included in the camera module, with a cold side of the thermoelectric cooler coupled to the thermal plate and a hot side of the thermoelectric cooler thermally coupled to a heat sink (or a thermal plate). A controller is coupled to the thermoelectric cooler and to the first temperature sensor. The controller is configured to generate a control signal in response to a comparison of the temperature of the image sensor to a stored temperature for the image sensor. The control signal adjusts transfer of heat between the cold side of the thermoelectric cooler and the hot side of the thermoelectric cooler.

In some embodiments, an enclosure includes a plurality of camera modules and an optical bench coupled to each of the plurality of camera modules. The optical bench is configured to maintain an alignment between the plurality of camera modules coupled to the optical bench. For example, the optical bench is coupled to a first camera module and to a second camera module to maintain an alignment of the first camera module relative to the second camera module and vice versa. In some embodiments, the optical bench is coupled to a portion of each camera module that is opposite to the heat sink included in a camera module.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

The terminology used herein for the purpose of describing particular examples is not intended to be limiting for further examples. Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements, and/or components, but do not preclude the presence or addition of one or more other features, integers, steps, operations, processes, acts, elements, components, and/or any group thereof. Additionally, when an element is described as "plurality," it is understood to mean two or more of such an element. However, as set forth above, further examples may implement the same functionality using a single element.

It will be understood that when an element is referred to as being "connected" or "coupled" to another element, the elements may be directly connected or coupled or via one or more intervening elements. Additionally, when elements are referred to as being "thermally coupled," the elements may be directly coupled to each other or coupled to each other via one or more intervening elements. Further, conductive heat transfer, radiative heat transfer, conductive heat transfer, or any combination thereof between elements is encompassed by elements being "thermally coupled" to each other. If two elements A and B are combined using an "or," this is to be understood to disclose all possible combinations, i.e. only A, only B, as well as A and B. An alternative wording for the same combinations is "at least one of A and B." The same applies for combinations of more than two elements.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

Figure 1:
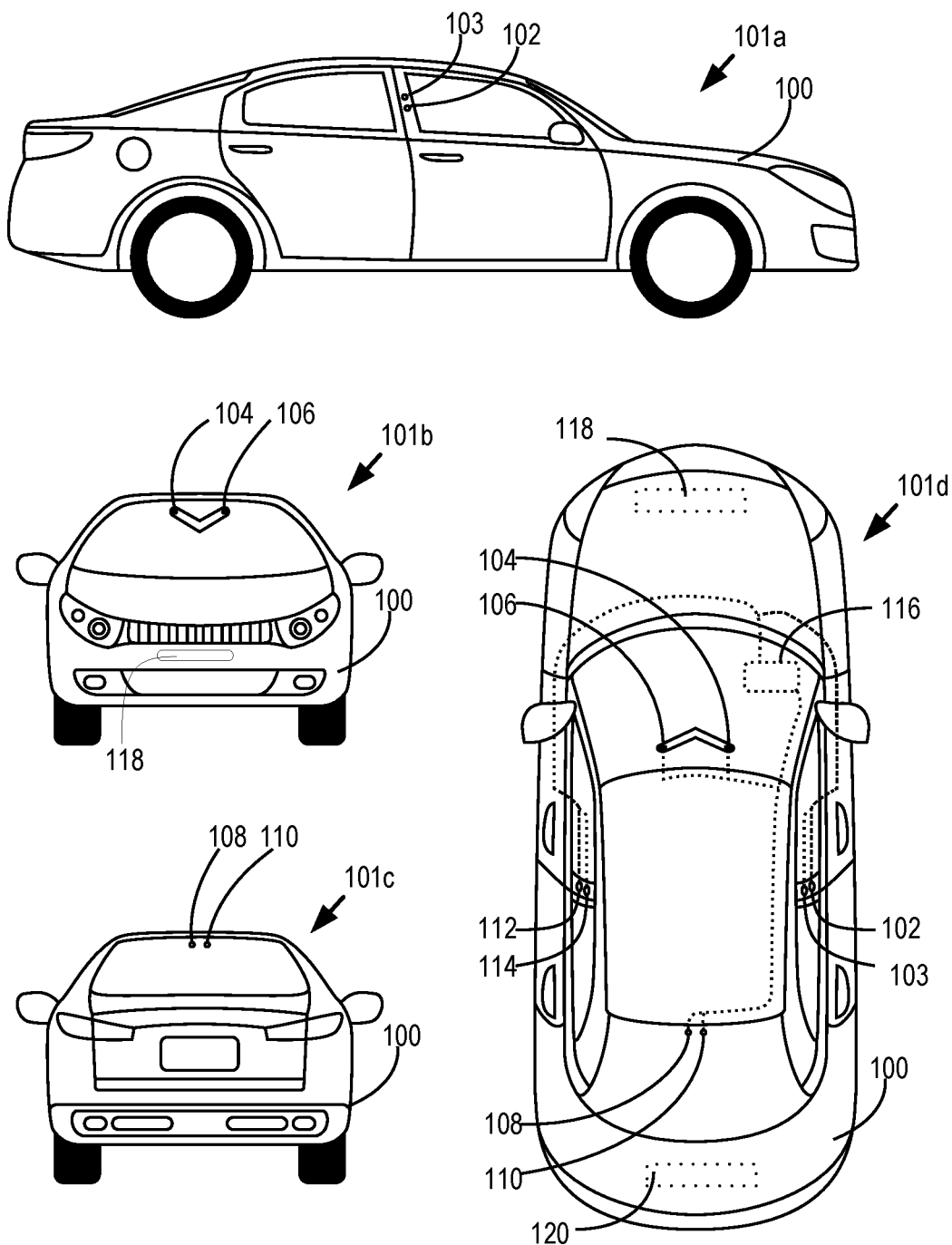
FIG. 1 shows example views of an autonomous vehicle according to some embodiments of the present disclosure.

FIG. 1 shows multiple views of an autonomous vehicle 100 including camera modules for cooling image sensors, such as image sensors in cameras, according to embodiments of the present disclosure. Right side view 101a shows a right side of the autonomous vehicle 100. Shown in the right-side view 101a are cameras 102 and 103, configured to capture image data, video data, and/or audio data of the environmental state of the autonomous vehicle 100 from the perspective of the right side of the car. Front view 101b shows a front side of the autonomous vehicle 100. Shown in the front view 101b are cameras 104 and 106, configured to capture image data, video data, and/or audio data of the environmental state of the autonomous vehicle 100 from the perspective of the front of the car. Rear view 101c shows a rear side of the autonomous vehicle 100. Shown in the rear view 101c are cameras 108 and 110, configured to capture image data, video data, and/or audio data of the environmental state of the autonomous vehicle 100 from the perspective of the rear of the car. Top view 101d shows a top side of the autonomous vehicle 100. Shown in the top view 101d are cameras 102-110. Also shown are cameras 112 and 114, configured to capture image data, video data, and/or audio data of the environmental state of the autonomous vehicle 100 from the perspective of the left side of the car.

Further shown in the top view 101d is an automation computing system 116. The automation computing system 116 comprises one or more computing devices configured to control one or more autonomous operations (e.g., autonomous driving operations) of the autonomous vehicle 100. For example, the automation computing system 116 may be configured to process sensor data (e.g., data from the cameras 102-114 and potentially other sensors), operational data (e.g., a speed, acceleration, gear, orientation, turning direction), and other data to determine an operational state and/or operational history of the autonomous vehicle. The automation computing system 116 may then determine one or more operational commands for the autonomous vehicle (e.g., a change in speed or acceleration, a change in brake application, a change in gear, a change in turning or orientation). The automation computing system 116 may also capture and store sensor data. Operational data of the autonomous vehicle may also be stored in association with corresponding sensor data, thereby indicating the operational data of the autonomous vehicle 100 at the time the sensor data was captured Also shown in the top view 101d is a radar sensor 118. The radar sensor 118 uses radio waves to detect objects in the environment relative to the autonomous vehicle 100. The radar sensor 118 may also detect or track various attributes of such objects, including distance, velocity, angle of movement and the like. The measurements of the radar sensor 118 may be provided as sensor data (e.g., radar data) to the automation computing system 116.

The radar data from the radar sensor 118 may be used in a variety of ways to facilitate autonomous driving functionality. As an example, the radar sensor 118 may be used in isolation or in conjunction with other sensors, such as camera sensors, to track persistence of various objects. As described herein, persistence includes determining that a particular object identified at a particular instance (e.g., in camera sensor data, in radar sensor 118 data, or both) is the same object in subsequent instances. The radar sensor 118 may also facilitate detecting the size, shape, type, or speed of particular objects. These detected attributes may be correlated with or used to verify estimations of these attributes from camera sensors. As a further example, the radar sensor 118 may facilitate detecting voids in the environment where no object is present.

The radar sensor 118 provides several differences than other sensors operating in detecting the environment relative to the autonomous vehicle 100. For example, the radar sensor 118 may provide for greater accuracy at longer distances. The radar sensor 118 may also provide for greater precision and more accurate estimations of velocity or movement of objects relative to other sensors. Moreover, as the radar sensor 118 does not operate in the optical spectrum, performance degradation of the radar sensor 118 in inclement weather is lesser than with camera sensors. Radar sensors 118 also provide some level of vertical resolution in some embodiments, with a tradeoff between distance and vertical resolution.

In some embodiments, the autonomous vehicle 100 may also include an additional radar sensor 120. For example, where the radar sensor 118 is positioned at a front bumper of the autonomous vehicle, the autonomous vehicle 100 may also include the additional radar sensor 120 positioned at the rear bumper. Such an additional radar sensor allows for multispectral (e.g., both visual and radar) coverage of the environment at the rear of the car. This provides advantages over ultrasonic sensors at the rear bumper which generally have a limited distance relative to radar.

Although the autonomous vehicle 100 of FIG. 1 is shown as car, it is understood that autonomous vehicles 100 may also include other vehicles, including motorcycles, planes, helicopters, unmanned aerial vehicles (UAVs, e.g., drones), or other vehicles. Moreover, it is understood that additional cameras or other external sensors may also be included in the autonomous vehicle 100.

Figure 2:
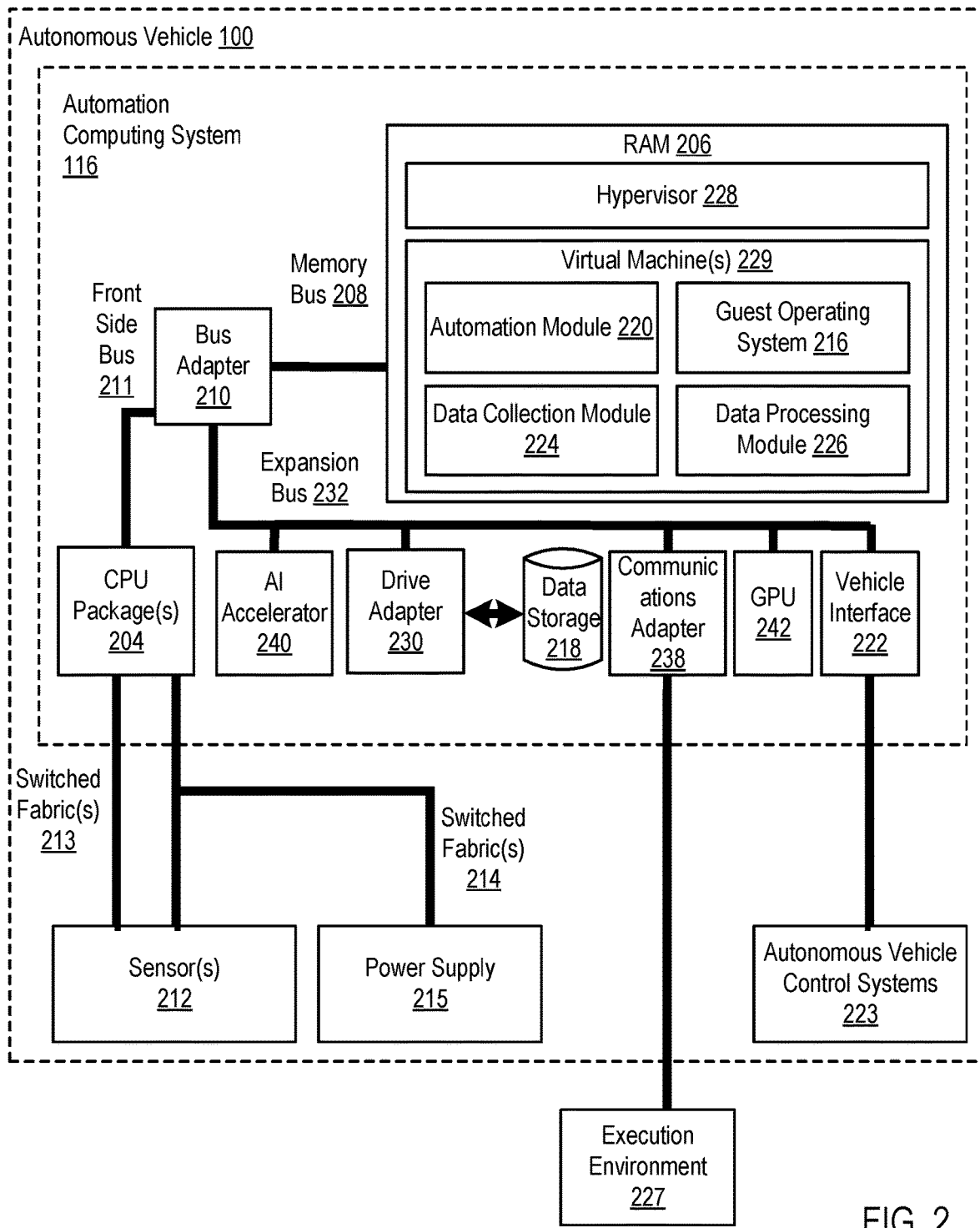
FIG. 2 is a block diagram of an autonomous computing system for an autonomous vehicle according to some embodiments of the present disclosure.

For further explanation, FIG. 2 sets forth a block diagram of automated computing machinery comprising an exemplary automation computing system 116 configured for synchronizing stereoscopic cameras using padding data setting modification according to specific embodiments. The automation computing system 116 of FIG. 2 includes at least one computer Central Processing Unit (CPU) package 204 as well as random access memory 206 ('RAM') which is connected through a high-speed memory bus 208 and bus adapter 210 to CPU packages 204 via a front side bus 211 and to other components of the automation computing system 116.

A CPU package 204 may comprise a plurality of processing units. For example, each CPU package 204 may comprise a logical or physical grouping of a plurality of processing units. Each processing unit may be allocated a particular process for execution. Moreover, each CPU package 204 may comprise one or more redundant processing units. A redundant processing unit is a processing unit not allocated a particular process for execution unless a failure occurs in another processing unit. For example, when a given processing unit allocated a particular process fails, a redundant processing unit may be selected and allocated the given process. A process may be allocated to a plurality of processing units within the same CPU package 204 or different CPU packages 204. For example, a given process may be allocated to a primary processing unit in a CPU package 204. The results or output of the given process may be output from the primary processing unit to a receiving process or service. The given process may also be executed in parallel on a secondary processing unit. The secondary processing unit may be included within the same CPU package 204 or a different CPU package 204. The secondary processing unit may not provide its output or results of the process until the primary processing unit fails. The receiving process or service will then receive data from the secondary processing unit. A redundant processing unit may then be selected and have allocated the given process to ensure that two or more processing units are allocated the given process for redundancy and increased reliability.

The CPU packages 204 are communicatively coupled to one or more sensors 212. The sensors 212 are configured to capture sensor data describing the operational and environmental conditions of an autonomous vehicle. For example, the sensors 212 may include cameras (e.g., the cameras 102-114 of FIG. 1), accelerometers, Global Positioning System (GPS) radios, Lidar sensors, or other sensors. As described herein, cameras may include a solid state sensor 212 with a solid-state shutter capable of measuring photons or a time of flight of photons. For example, a camera may be configured to capture or measure photons captured via the shutter for encoding as images and/or video data. As another example, a camera may emit photons and measure the time of flight of the emitted photons. Cameras may also include event cameras configured to measure changes in light and/or motion of light.

Although the sensors 212 are shown as being external to the automation computing system 116, it is understood that one or more of the sensors 212 may reside as a component of the automation computing system 116 (e.g., on the same board, within the same camera module or chassis). The sensors 212 may be communicatively coupled with the CPU packages 204 via a switched fabric 213. The switched fabric 213 comprises a communications topology through which the CPU packages 204 and sensors 212 are coupled via a plurality of switching mechanisms (e.g., latches, switches, crossbar switches, field programmable gate arrays (FPGAs)). For example, the switched fabric 213 may implement a mesh connection connecting the CPU packages 204 and sensors 212 as endpoints, with the switching mechanisms serving as intermediary nodes of the mesh connection. The CPU packages 204 and sensors 212 may be in communication via a plurality of switched fabrics 213. For example, each of the switched fabrics 213 may include the CPU packages 204 and sensors 212, or a subset of the CPU packages 204 and sensors 212, as endpoints. Each switched fabric 213 may also comprise a respective plurality of switching components. The switching components of a given switched fabric 213 may be independent (e.g., not connected) of the switching components of other switched fabrics 213 such that only switched fabric 213 endpoints (e.g., the CPU packages 204 and sensors 212) are overlapping across the switched fabrics 213. This provides redundancy such that, should a connection between a CPU package 204 and sensor 212 fail in one switched fabric 213, the CPU package 204 and sensor 212 may remain connected via another switched fabric 213. Moreover, in the event of a failure in a CPU package 204, a processor of a CPU package 204, or a sensor, a communications path excluding the failed component and including a functional redundant component may be established.

The CPU packages 204 and sensors 212 are configured to receive power from one or more power supplies 215. The power supplies 215 may comprise an extension of a power system of the autonomous vehicle 100 or an independent power source (e.g., a battery, a capacitor). The power supplies 215 may supply power to the CPU packages 204 and sensors 212 by another switched fabric 214. The switched fabric 214 provides redundant power pathways such that, in the event of a failure in a power connection, a new power connection pathway may be established to the CPU packages 204 and sensors 212.

Stored in RAM 206 is an automation module 220. The automation module 220 may be configured to process sensor data from the sensors 212 to determine a driving decision for the autonomous vehicle. The driving decision comprises one or more operational commands for an autonomous vehicle 100 to affect the movement, direction, or other function of the autonomous vehicle 100, thereby facilitating autonomous driving or operation of the vehicle. Such operational commands may include a change in the speed of the autonomous vehicle 100, a change in steering direction, a change in gear, or other commands. For example, the automation module 220 may provide sensor data and/or processed sensor data as one or more inputs to a trained machine learning model (e.g., a trained neural network) to determine the one or more operational commands. The operational commands may then be communicated to autonomous vehicle control systems 223 via a vehicle interface 222.

In some embodiments, the automation module 220 may be configured to determine an exit path for an autonomous vehicle 100 in motion. The exit path includes one or more operational commands that, if executed, are determined and/or predicted to bring the autonomous vehicle 100 safely to a stop (e.g., without collision with an object, without violating one or more safety rules). The automation module 220 may determine both a driving decision and an exit path at a predefined interval. The automation module 220 may then send the driving decision and the exit path to the autonomous vehicle control systems 223. The autonomous vehicle control systems 223 may be configured to execute the driving decision unless an error state has been reached. If an error decision has been reached, therefore indicating a possible error in functionality of the automation computing system 116, the autonomous vehicle control systems 223 may then execute a last received exit path in order to bring the autonomous vehicle 100 safely to a stop. Thus, the autonomous vehicle control systems 223 are configured to receive both a driving decision and exit path at predefined intervals, and execute the exit path in response to an error.

The autonomous vehicle control systems 223 are configured to affect the movement and operation of the autonomous vehicle 100. For example, the autonomous vehicle control systems 223 may activate (e.g., apply one or more control signals) to actuators or other components to turn or otherwise change the direction of the autonomous vehicle 100, accelerate or decelerate the autonomous vehicle 100, change a gear of the autonomous vehicle 100, or otherwise affect the movement and operation of the autonomous vehicle 100.

Further stored in RAM 206 is a data collection module 224 configured to process and/or store sensor data received from the one or more sensors 212. For example, the data collection module 224 may store the sensor data as captured by the one or more sensors 212, or processed sensor 212 data (e.g., sensor 212 data having object recognition, compression, depth filtering, or any combination of these). Such processing may be performed by the data collection module 224 in real-time or in substantially real-time as the sensor data is captured by the one or more sensors 212. The processed sensor data may then be used by other functions or modules. For example, the automation module 220 may use processed sensor data as input to determine one or more operational commands. The data collection module 224 may store the sensor data in data storage 218.

Also stored in RAM 206 is a data processing module 226. The data processing module 226 is configured to perform one or more processes on stored sensor data (e.g., stored in data storage 218 by the data collection module 224) prior to upload to an execution environment 227. Such operations can include filtering, compression, encoding, decoding, or other operations. The data processing module 226 may then communicate the processed and stored sensor data to the execution environment 227.

Further stored in RAM 206 is a hypervisor 228. The hypervisor 228 is configured to manage the configuration and execution of one or more virtual machines 229. For example, each virtual machine 229 may emulate and/or simulate the operation of a computer. Accordingly, each virtual machine 229 may comprise a guest operating system 216 for the simulated computer. Each instance of virtual machine 229 may host the same operating system or one or more different operating systems. The hypervisor 228 may manage the creation of a virtual machine 229 including installation of the guest operating system 216. The hypervisor 228 may also manage when execution of a virtual machine 229 begins, is suspended, is resumed, or is terminated. The hypervisor 228 may also control access to computational resources (e.g., processing resources, memory resources, device resources) by each of the virtual machines.

Each of the virtual machines 229 may be configured to execute one or more of the automation modules 220, the data collection module 224, the data processing module 226, or combinations thereof. Moreover, as is set forth above, each of the virtual machines 229 may comprise its own guest operating system 216. Guest operating systems 216 useful in autonomous vehicles in accordance with some embodiments of the present disclosure include UNIX™, Linux™, Microsoft Windows™, AIX™, IBM's i OS™, and others. For example, the autonomous vehicle 100 may be configured to execute a first operating system when the autonomous vehicle is in an autonomous (or partially autonomous) driving mode and the autonomous vehicle 100 may be configured to execute a second operating system when the autonomous vehicle is not in an autonomous (or partially autonomous) driving mode. In such an example, the first operating system may be formally verified, secure, and operate in real-time such that data collected from the sensors 212 are processed within a predetermined period of time, and autonomous driving operations are performed within a predetermined period of time, such that data is processed and acted upon essentially in real-time. Continuing with this example, the second operating system may not be formally verified, may be less secure, and may not operate in real-time as the tasks that are carried out (which are described in greater detail below) by the second operating system are not as time-sensitive the tasks (e.g., carrying out self-driving operations) performed by the first operating system.

Although the example included in the preceding paragraph relates to an embodiment where the autonomous vehicle 100 may be configured to execute a first operating system when the autonomous vehicle is in an autonomous (or partially autonomous) driving mode and the autonomous vehicle 100 may be configured to execute a second operating system when the autonomous vehicle is not in an autonomous (or partially autonomous) driving mode, other embodiments are within the scope of the present disclosure. For example, in another embodiment one CPU (or other appropriate entity such as a chip, CPU core, and so on) may be executing the first operating system and a second CPU (or other appropriate entity) may be executing the second operating system, where switching between these two modalities is accomplished through fabric switching, as described in greater detail below. Likewise, in some embodiments, processing resources such as a CPU may be partitioned where a first partition supports the execution of the first operating system and a second partition supports the execution of the second operating system.

The guest operating systems 216 may correspond to a particular operating system modality. An operating system modality is a set of parameters or constraints which a given operating system satisfies, and are not satisfied by operating systems of another modality. For example, a given operating system may be considered a "real-time operating system" in that one or more processes executed by the operating system must be performed according to one or more time constraints. The time constraint may not necessarily be in real-time, but instead with the highest or one of the highest priorities so that operations indicated for a real-time modality are executed faster than operations without such a priority. For example, as the automation module 220 must make determinations as to operational commands to facilitate autonomous operation of a vehicle. Accordingly, the automation module 220 must make such determinations within one or more time constraints in order for autonomous operation to be performed in real-time. The automation module 220 may then be executed in an operating system (e.g., a guest operating system 216 of a virtual machine 229) corresponding to a "real-time operating system" modality. Conversely, the data processing module 226 may be able to perform its processing of sensor data independent of any time constraints, and may then be executed in an operating system (e.g., a guest operating system 216 of a virtual machine 229) corresponding to a "non-real-time operating system" modality.

As another example, an operating system (e.g., a guest operating system 216 of a virtual machine 229) may comprise a formally verified operating system. A formally verified operating system is an operating system for which the correctness of each function and operation has been verified with respect to a formal specification according to formal proofs. A formally verified operating system and an unverified operating system (e.g., one that has not been formally verified according to these proofs) can be said to operate in different modalities.

The automation module 220, data collection module 224, data processing module 226, hypervisor 228, and virtual machine 229 in the example of FIG. 2 are shown in RAM 206, but many components of such software typically are stored in non-volatile memory also, such as, for example, on data storage 218, such as a disk drive. Moreover, any of the automation module 220, data collection module 224, and data processing module 226 may be executed in a virtual machine 229 and facilitated by a guest operating system 216 of that virtual machine 229.

The automation computing system 116 of FIG. 2 includes disk drive adapter 230 coupled through expansion bus 232 and bus adapter 210 to CPU package(s) 204 and other components of the automation computing system 116. Disk drive adapter 230 connects non-volatile data storage to the automation computing system 116 in the form of data storage 218. Disk drive adapters 230 useful in computers configured for synchronizing stereoscopic cameras using padding data setting modification according to various embodiments include Integrated Drive Electronics ('IDE') adapters, Small Computer System Interface ('SCSI') adapters, and others. Non-volatile computer memory also may be implemented for as an optical disk drive, electrically erasable programmable read-only memory (so-called 'EEPROM' or 'Flash' memory), RAM drives, and so on.

The exemplary automation computing system 116 of FIG. 2 includes a communications adapter 238 for data communications with other computers and for data communications with a data communications network. Such data communications may be carried out serially through RS-238 connections, through external buses such as a Universal Serial Bus ('USB'), through data communications networks such as IP data communications networks, and in other ways. Communications adapters implement the hardware level of data communications through which one computer sends data communications to another computer, directly or through a data communications network. Examples of communications adapters useful in computers configured for synchronizing stereoscopic cameras using padding data setting modification according to specific embodiments include modems for wired dial-up communications, Ethernet (IEEE 802.3) adapters for wired data communications, 802.11 adapters for wireless data communications, as well as mobile adapters (e.g., cellular communications adapters) for mobile data communications. For example, the automation computing system 116 may communicate with one or more remotely disposed execution environments 227 via the communications adapter 238.

The exemplary automation computing system of FIG. 2 also includes one or more Artificial Intelligence (AI) accelerators 240. The AI accelerator 240 provides hardware-based assistance and acceleration of AI-related functions, including machine learning, computer vision, etc. Accordingly, performance of any of the automation module 220, data collection module 224, data processing module 226, or other operations of the automation computing system 116 may be performed at least in part by the AI accelerators 240.

The exemplary automation computing system of FIG. 2 also includes one or more graphics processing units (GPUs) 242. The GPUs 242 are configured to provide additional processing and memory resources for processing image and/or video data, including encoding, decoding, etc. Accordingly, performance of any of the automation module 220, data collection module 224, data processing module 226, or other operations of the automation computing system 116 may be performed at least in part by the GPUs 242.

Figure 3:
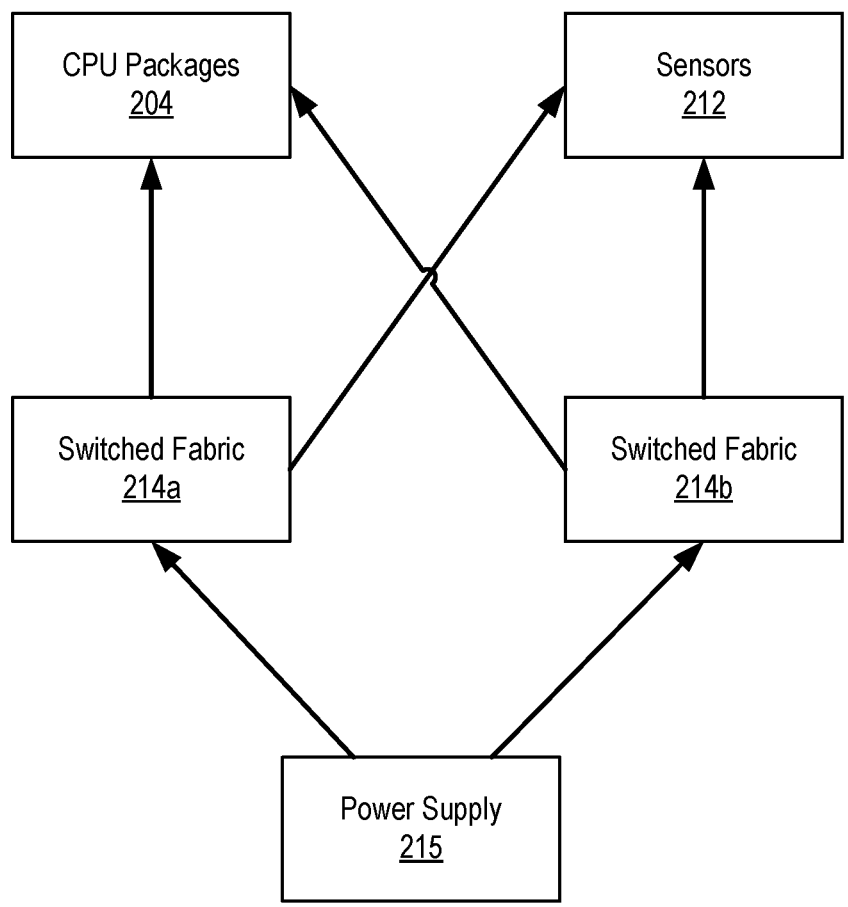
FIG. 3 is a block diagram of a redundant power fabric for an autonomous vehicle according to some embodiments of the present disclosure.

FIG. 3 shows an example redundant power fabric for an autonomous vehicle 100. The redundant power fabric provides redundant pathways for power transfer between the power supplies 215, the sensors 212, and the CPU packages 204. In this example, the power supplies 215 are coupled to the sensors 212 and CPU packages 204 via two switched fabrics 214a and 214b. The topology shown in FIG. 3 provides redundant pathways between the power supplies 215, the sensors 212, and the CPU packages 204 such that power can be rerouted through any of multiple pathways in the event of a failure in an active connection pathway. The switched fabrics 214a and 214b may provide power to the sensors 212 using various connections, including Mobile Industry Processor Interface (MIPI), Inter-Integrated Circuit (I2C), Universal Serial Bus (USB), or another connection. The switched fabrics 214a and 214b may also provide power to the CPU packages 204 using various connections, including Peripheral Component Interconnect Express (PCIe), USB, or other connections. Although only two switched fabrics 214a and 214b are shown connecting the power supplies 215 to the sensors 212 and CPU packages 204, the approach shown by FIG. 3 can be modified to include three, four, five, or more switched fabrics 214.

Figure 4:
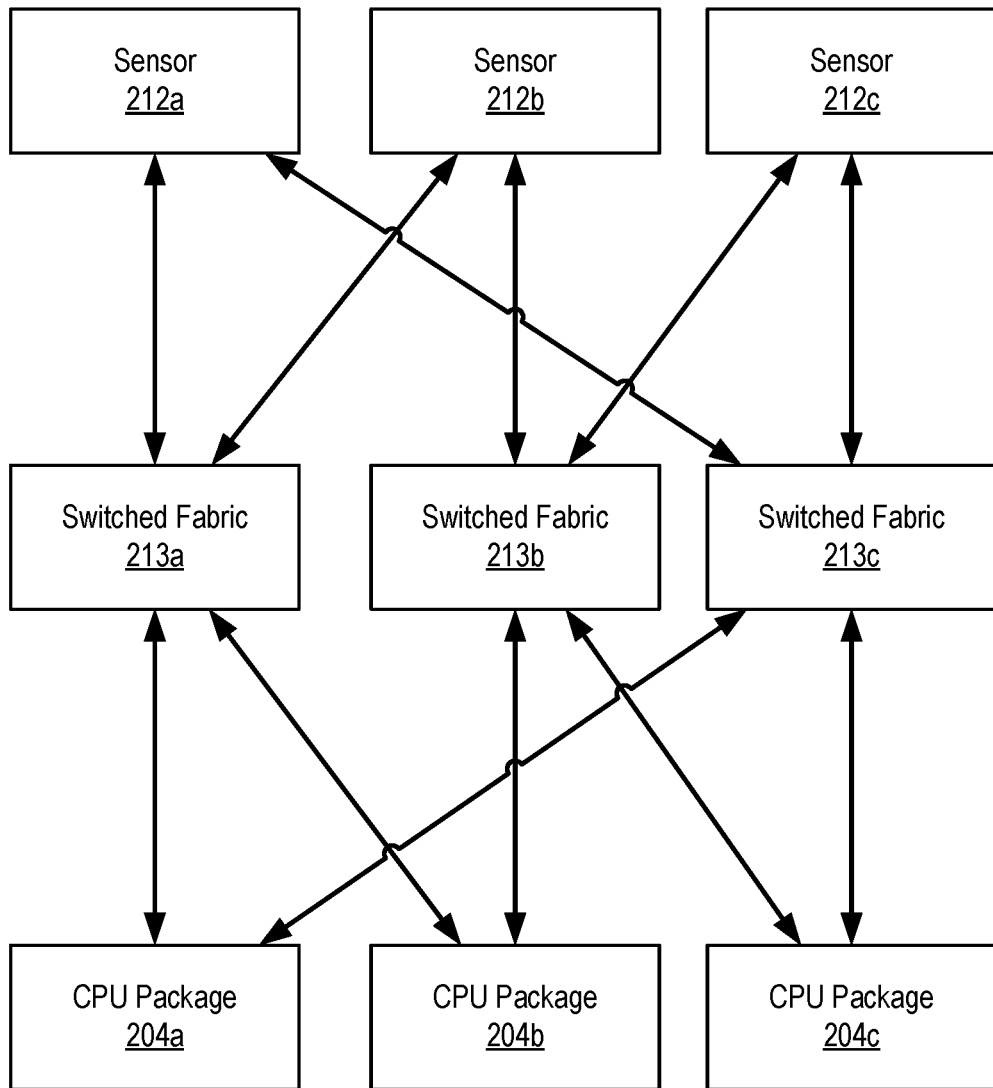
FIG. 4 is a block diagram of a redundant data fabric for an autonomous vehicle according to some embodiments of the present disclosure.

FIG. 4 is an example redundant data fabric for an autonomous vehicle 100. The redundant data fabric provides redundant data connection pathways between sensors 212 and CPU packages 204. In this example view, three CPU packages 204a, 204b, and 204c are connected to three sensors 212a, 212b, and 212c via three switched fabrics 213a, 213b, and 213c. Each CPU package 204a, 204b, and 204c is connected to a subset of the switched fabrics 213a, 213b, and 213c. For example, CPU package 204a is connected to switched fabrics 213a and 213c, CPU package 204b is connected to switched fabrics 213a and 213b, and CPU package 204c is connected to switched fabrics 213b and 213c. Each switched fabric 213a, 213b, and 213c is connected to a subset of the sensors 212a, 212b, and 212c. For example, switched fabric 213a is connected to sensors 212a and 212b, switched fabric 213b is connected to sensor 212b and 212c, and switched fabric 213c is connected to sensors 212a and 212c. Under this topology, each CPU package 204a, 204b, and 204c has an available connection path to any sensor 212a, 212b, and 212c. It is understood that the topology of FIG. 4 is exemplary, and that CPU packages, switched fabrics, sensors, or connections between components may be added or removed while maintaining redundancy.

Figure 5:
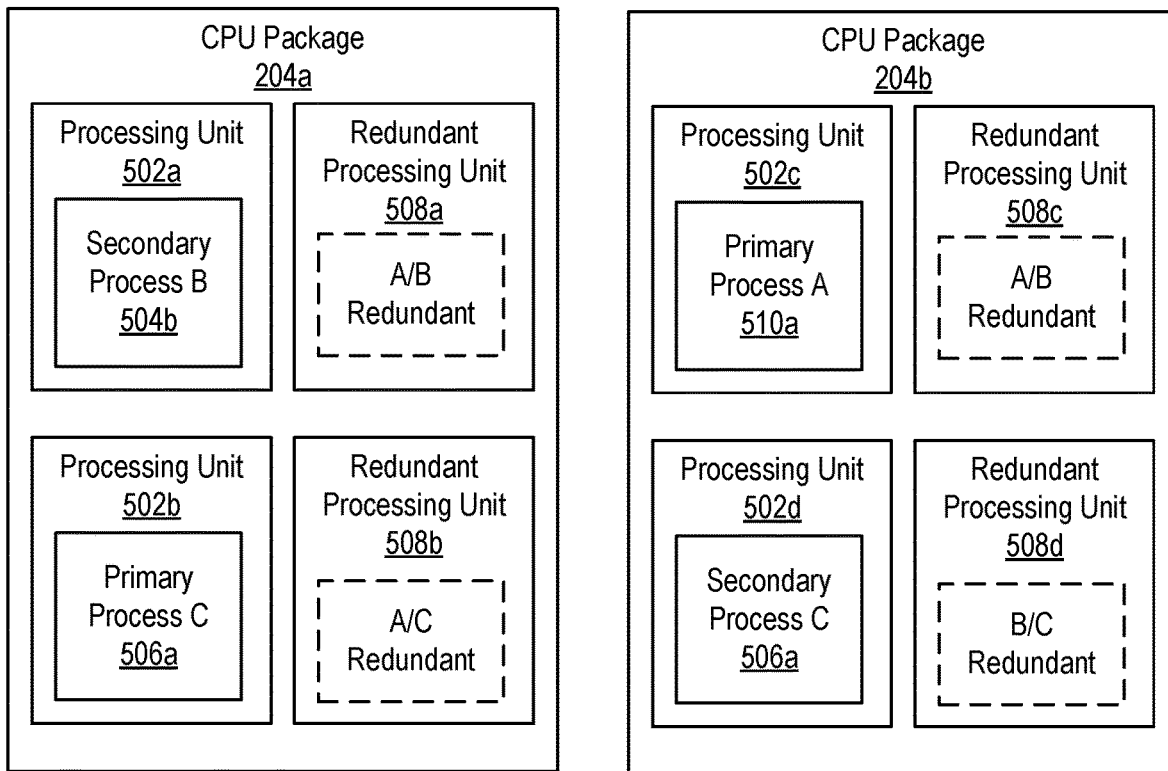
FIG. 5 is an example view of process allocation across CPU packages for an autonomous vehicle according to some embodiments of the present disclosure.
Figure 5:
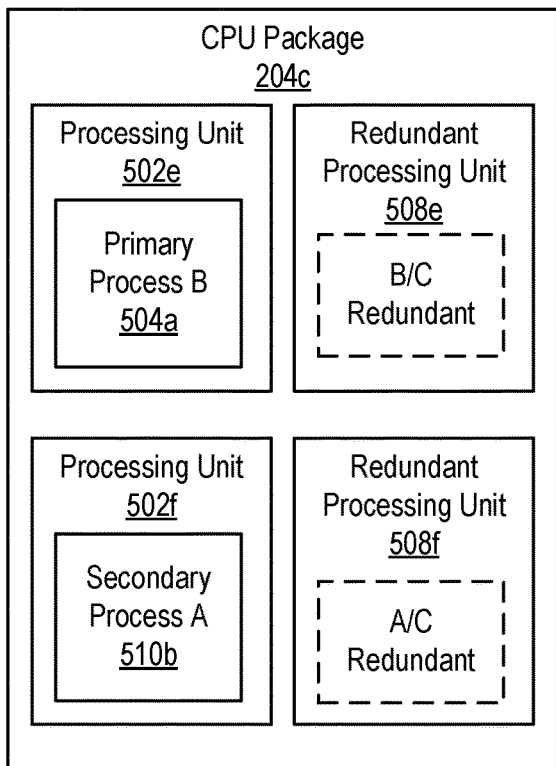

FIG. 5 is an example view of process allocation across CPU packages for an autonomous vehicle. Shown are three CPU packages 204a, 204b, and 204c. Each CPU package 204a includes a processing unit that has been allocated (e.g., by a hypervisor 228 or other process or service) primary execution of a process and another processing unit that has been allocated secondary execution of a process. As set forth herein, primary execution of a process describes an executing instance of a process whose output will be provided to another process or service. Secondary execution of the process describes executing an instance of the process in parallel to the primary execution, but the output may not be output to the other process or service. For example, in CPU package 204a, processing unit 502a has been allocated secondary execution of "process B," denoted as secondary process B 504b, while processing unit 502b has been allocated primary execution of "process C," denoted as primary process C 506a.

CPU package 204a also comprises two redundant processing units that are not actively executing a process A, B, or C, but are instead reserved in case of failure of an active processing unit. Redundant processing unit 508*a* has been reserved as "A/B redundant," indicating that reserved processing unit 508*a* may be allocated primary or secondary execution of processes A or B in the event of a failure of a processing unit allocated the primary or secondary execution of these processes. Redundant processing unit 508*b* has been reserved as "A/C redundant," indicating that reserved processing unit 508*b* may be allocated primary or secondary execution of processes A or C in the event of a failure of a processing unit allocated the primary or secondary execution of these processes.

CPU package 204*b* includes processing unit 502*c*, which has been allocated primary execution of "process A," denoted as primary process A 510*a*, and processing unit 502*d*, which has been allocated secondary execution of "process C," denoted as secondary process C 506*a*. CPU package 204*b* also includes redundant processing unit 508*c*, reserved as "A/B redundant," and redundant processing unit 508*d*, reserved as "B/C redundant." CPU package 204*c* includes processing unit 502*e*, which has been allocated primary execution of "process B," denoted as primary process B 504*a*, and processing unit 502*f*, which has been allocated secondary execution of "process A," denoted as secondary process A 510*b*. CPU package 204*c* also includes redundant processing unit 508*e*, reserved as "B/C redundant," and redundant processing unit 508*f*, reserved as "A/C redundant."

As set forth in the example view of FIG. 5, primary and secondary instances processes A, B, and C are each executed in an allocated processing unit. Thus, if a processing unit performing primary execution of a given process fails, the processing unit performing secondary execution may instead provide output of the given process to a receiving process or service. Moreover, the primary and secondary execution of a given process are executed on different CPU packages. Thus, if an entire processing unit fails, execution of each of the processes can continue using one or more processing units handling secondary execution. The redundant processing units 508*a-f* allow for allocation of primary or secondary execution of a process in the event of processing unit failure. This further prevents errors caused by processing unit failure as parallel primary and secondary execution of a process may be restored. The number of CPU packages, processing units, redundant processing units, and processes may be modified according to performance requirements while maintaining redundancy.

Figure 6:
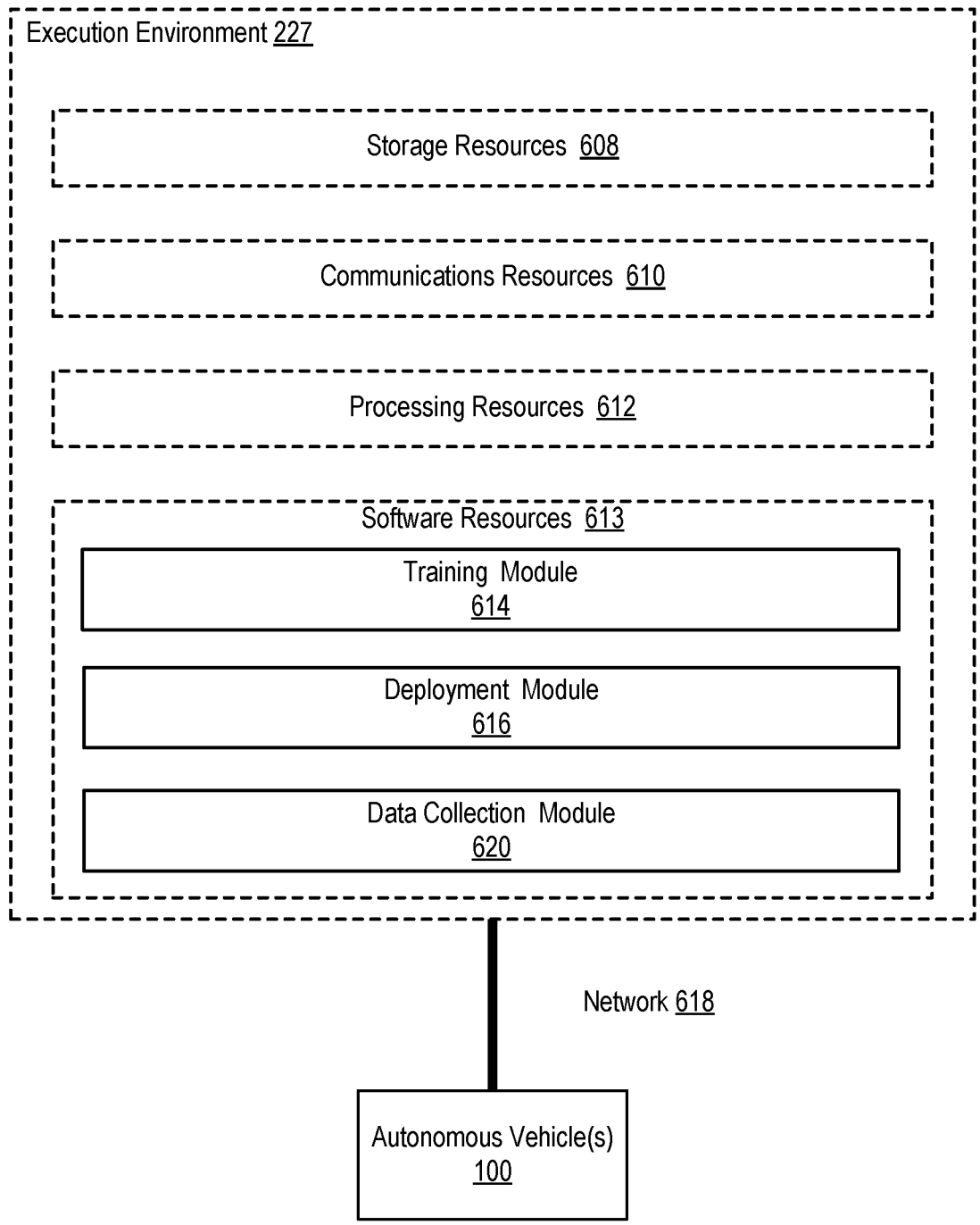
FIG. 6 is an example view of an execution environment for an autonomous vehicle according to some embodiments of the present disclosure

For further explanation, FIG. 6 sets forth a diagram of an execution environment 227 in accordance with some embodiments of the present disclosure. The execution environment 227 depicted in FIG. 6 may be embodied in a variety of different ways. The execution environment 227 may be provided, for example, by one or more physical or virtual machine components consisting of bare-metal applications, operating systems such as Android, Linux, Real-time Operating systems (RTOS), Automotive RTOS, such as AutoSAR, and others, including combinations thereof. The execution environment 227 may also be provided by cloud computing providers such as Amazon AWS™, Microsoft Azure™, Google Cloud™, and others, including combinations thereof. Alternatively, the execution environment 227 may be embodied as a collection of devices (e.g., servers, storage devices, networking devices) and software resources that are included in a computer or distributed computer or private data center. The execution environment 227 may be constructed in a variety of other ways and may even include resources within one or more autonomous vehicles or resources that communicate with one or more autonomous vehicles.

The execution environment 227 depicted in FIG. 6 may include storage resources 608, which may be embodied in many forms. For example, the storage resources 608 may include flash memory, hard disk drives, nano-RAM, 3D crosspoint non-volatile memory, MRAM, non-volatile phase-change memory (PCM), storage class memory (SCM), or many others, including combinations of the storage technologies described above. Other forms of computer memories and storage devices may be utilized as part of the execution environment 227, including DRAM, SRAM, EEPROM, universal memory, and many others. The storage resources 608 may also be embodied, in embodiments where the execution environment 227 includes resources offered by a cloud provider, as cloud storage resources such as Amazon Elastic Block Storage (EBS) block storage, Amazon S3 object storage, Amazon Elastic File System (EFS) file storage, Azure Blob Storage, and many others. The example execution environment 227 depicted in FIG. 6 may implement a variety of storage architectures, such as block storage where data is stored in blocks, and each block essentially acts as an individual hard drive, object storage where data is managed as objects, or file storage in which data is stored in a hierarchical structure. Such data may be saved in files and folders, and presented to both the system storing it and the system retrieving it in the same format.

The execution environment 227 depicted in FIG. 6 also includes communications resources 610 that may be useful in facilitating data communications between components within the execution environment 227, as well as data communications between the execution environment 227 and computing devices that are outside of the execution environment 227. Such communications resources may be embodied, for example, as one or more routers, network switches, communications adapters, and many others, including combinations of such devices. The communications resources 610 may be configured to utilize a variety of different protocols and data communication fabrics to facilitate data communications. For example, the communications resources 610 may utilize Internet Protocol ('IP') based technologies, fibre channel (FC) technologies, FC over ethernet (FCOE) technologies, InfiniBand (IB) technologies, NVM Express (NVMe) technologies and NVMe over fabrics (NVMeoF) technologies, and many others. The communications resources 610 may also be embodied, in embodiments where the execution environment 227 includes resources offered by a cloud provider, as networking tools and resources that enable secure connections to the cloud as well as tools and resources (e.g., network interfaces, routing tables, gateways) to configure networking resources in a virtual private cloud. Such communications resources may be useful in facilitating data communications between components within the execution environment 227, as well as data communications between the execution environment 227 and computing devices that are outside of the execution environment 227 (e.g., computing devices that are included within an autonomous vehicle).

The execution environment 227 depicted in FIG. 6 also includes processing resources 612 that may be useful in useful in executing computer program instructions and performing other computational tasks within the execution environment 227. The processing resources 612 may include one or more application-specific integrated circuits (ASICs) that are customized for some particular purpose, one or more central processing units (CPUs), one or more digital signal processors (DSPs), one or more field-programmable gate arrays (FPGAs), one or more systems on a chip (SoCs), or other form of processing resources 612. The processing resources 612 may also be embodied, in embodiments where the execution environment 227 includes resources offered by a cloud provider, as cloud computing resources such as one or more Amazon Elastic Compute Cloud (EC2) instances, event-driven compute resources such as AWS Lambdas, Azure Virtual Machines, or many others.

The execution environment 227 depicted in FIG. 6 also includes software resources 613 that, when executed by processing resources 612 within the execution environment 227, may perform various tasks. The software resources 613 may include, for example, one or more modules of computer program instructions that when executed by processing resources 612 within the execution environment 227 are useful in training neural networks configured to determine control autonomous vehicle control operations. For example, a training module 614 may train a neural network using training data including sensor 212 data and control operations recorded or captured contemporaneous to the training data. In other words, the neural network may be trained to encode a relationship between an environment relative to an autonomous vehicle 100 as indicated in sensor 212 data and the corresponding control operations effected by a user or operation of the autonomous vehicle. The training module 614 may provide a corpus of training data, or a selected subset of training data, to train the neural network. For example, the training module 614 may select particular subsets of training data associated with particular driving conditions, environment states, etc. to train the neural network.

The software resources 613 may include, for example, one or more modules of computer program instructions that when executed by processing resources 612 within the execution environment 227 are useful in deploying software resources or other data to autonomous vehicles 100 via a network 618. For example, a deployment module 616 may provide software updates, neural network updates, or other data to autonomous vehicles 100 to facilitate autonomous vehicle control operations.

The software resources 613 may include, for example, one or more modules of computer program instructions that when executed by processing resources 612 within the execution environment 227 are useful in collecting data from autonomous vehicles 100 via a network 618. For example, a data collection module 620 may receive, from autonomous vehicles 100, collected sensor 212, associated control operations, software performance logs, or other data. Such data may facilitate training of neural networks via the training module 614 or stored using storage resources 608.

Figure 7:
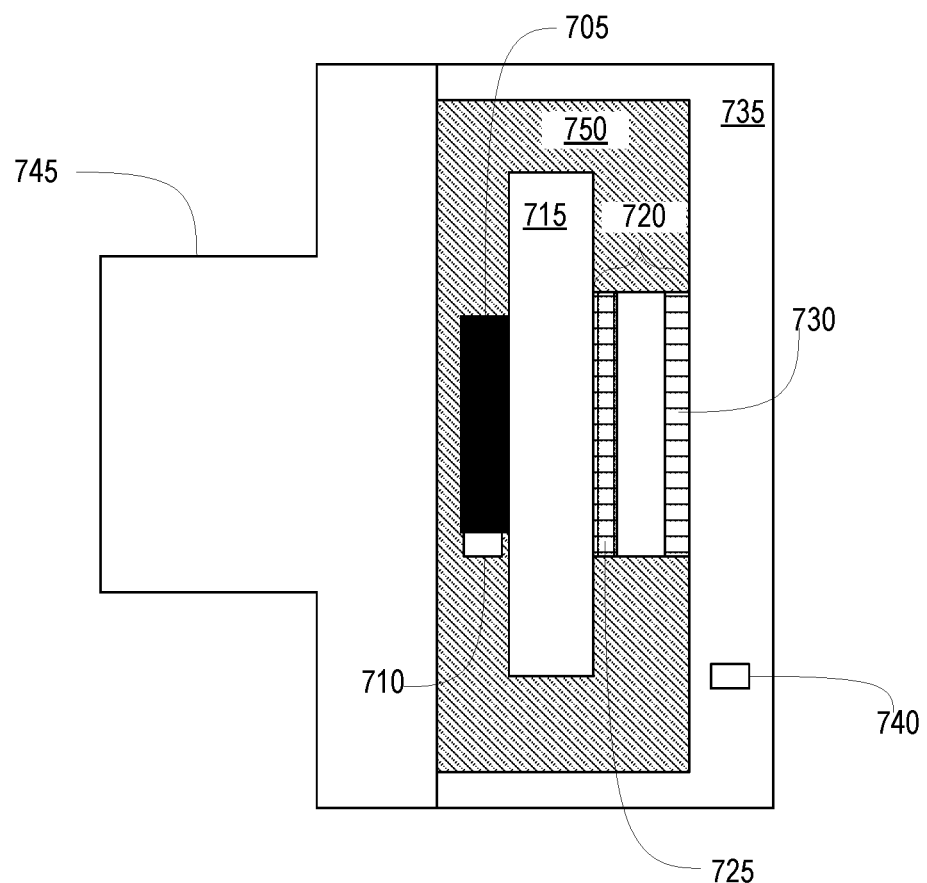
FIG. 7 is a cross section of a camera module for regulating temperature of an image sensor according to some embodiments of the present disclosure.

For further explanation, FIG. 7 shows a cross-section of a camera module 700 for regulating temperature of an image sensor 705, according to some embodiments of the present disclosure. In various embodiments, the camera module 700 is positioned as a camera, such as cameras 102-114 further described above in conjunction with FIG. 1. The camera module 700 is included in a passenger compartment of an autonomous vehicle 100 (e.g., in a location of camera 104, 106, 108, 110) in various embodiments. Alternatively, the camera module 700 is coupled to an external surface of the autonomous vehicle 100 or has a different location in or on the autonomous vehicle 100.

The image sensor 705 is configured to capture images of an area surrounding the autonomous vehicle. For example, the image sensor 705 captured images of an area within a field of view of the image sensor 705. The image sensor 705 has different resolutions in different embodiments. For example, the image sensor 705 has a resolution of 50 megapixels or greater, while in other examples, the image sensor 705 has different resolutions. In some embodiments, the image sensor 705 is a complementary metal oxide semiconductor (CMOS) image sensor. In other embodiments, the image sensor 705 is a charge coupled device (CCD), a negatively doped metal oxide semiconductor (NMOS) image sensor, a positively doped metal oxide semiconductor (PMOS) image sensor, or uses another imaging technology or combination of imaging technologies. Hence, different types of image sensor 705 are capable of being used in different embodiments. Further, the image sensor 705, as used herein, includes components other than a light receptive portion. Example components included in the image sensor 705 include transistors, capacitors, a printed circuit board, while additional or alternative components are included in some embodiments.

A first temperature sensor 710 is configured to capture a temperature of the image sensor 705. In some implementations, the first temperature sensor 710 is coupled to the image sensor 705, proximate to the image sensor 705 but does not contact the image sensor 705, or a part integrated with the image sensor 705 (e.g., part of a printed circuit board, in the same packaging as the image sensor 705). Various types of temperature sensor may be used for the first temperature sensor 710 in different embodiments. Example types of temperature sensor include: a thermocouple, a resistance temperature detector, a thermistor, a temperature sensor integrated circuit, an infrared temperature sensor, or other types of temperature sensor. In various embodiments, the first temperature sensor 710 is embedded within the image sensor 705 or is thermally coupled to a surface of the image sensor 705. For example, the first temperature sensor 710 is a thermocouple embedded within the image sensor 705 and thermally contacting a surface of the image sensor 705. The first temperature sensor 710 is coupled to a controller, which is further described below in conjunction with FIG. 10.

A thermal plate (e.g., hot plate, cold plate) 715 is thermally coupled to the image sensor 705. The thermal plate 715 is thermally coupled to a surface of the image sensor 705 that is opposite to a surface of the image sensor 705 that received light to capture images. In various embodiments, the thermal plate 715 is physically coupled to the image sensor 705. Thermally coupling the thermal plate 715 to the image sensor 705 enables conductive transfer of heat from the image sensor 705 to the thermal plate 715, and vice versa because of contact between the thermal plate 715 and the image sensor 705 causing molecular vibrations from heat of the image sensor 705 to cause molecular vibrations to the thermal plate 715, and vice versa. The thermal plate 715 is a thermally conductive material. For example, the thermal plate 715 is a plate of copper, aluminum, or other thermally conductive material or combination of thermally conductive materials. The thermal plate 715 has dimensions exceeding dimensions of the image sensor 705. For example, a length of the thermal plate 715 is greater than a length of the image sensor 705, a width of the thermal plate 715 is greater than a width of the image sensor 705, or the length of the thermal plate 715 is greater than the length of the image sensor 705 and the width of the thermal plate 715 is greater than the width of the image sensor 705.

A thermoelectric cooler 720, such as a Peltier device or other heat rejection devices, is coupled to the thermal plate 715 so a cold side 725 of the thermoelectric cooler 720 is thermally coupled to the thermal plate 715. For example, a Peltier device may operate on the Peltier effect that creates a cooling effect through thermoelectric means. Alternate embodiments of the camera module 700 may include other forms of cooling, such as vapor-based cooling systems, absorption based systems, refrigeration based systems, and many others. Thus, the thermal plate 715 is a heat spreader for transferring heat from the image sensor 705 to the cold side 725 of the thermoelectric cooler 720 or for transferring heat from the cold side 725 of the thermoelectric cooler 720 to the image sensor 705. In various embodiments, a thermal interface material (TIM) is between the thermal plate 715 and the cold side 725 of the thermoelectric cooler 720 to increase thermal conductance between contact surfaces of the thermal plate 715 and the cold side 725 of the thermoelectric cooler 720. Examples of thermal interface materials include: thermal paste, thermal adhesive, thermal gap filler, a thermally conductive pad, thermal tape, a phase change material, or metal. Insertion of a TIM between the thermal plate 715 and the cold side 725 of the thermoelectric cooler 720 reduces thermal boundary resistance between the thermal plate 715 and the cold side 725 of the thermoelectric cooler 720 to improve heat transfer between the thermal plate 715 and the cold side 725 of the thermoelectric cooler 720. Hence, the thermoelectric cooler 720 is coupled to the image sensor 705 via the thermal plate 715, with the thermal plate 715 configured to provide conductive heat transfer between the image sensor 705 and the thermoelectric cooler 720, and vice versa, without having conductive thermal transfer directly between the image sensor 705 and the thermoelectric cooler 720.

The thermoelectric cooler 720 includes the cold side 725 and a hot side 730 that is approximately opposite to and approximately parallel to the cold side 725. Alternating p-type and n-type semiconductors are placed thermally in parallel to each other and electrically in series with each other, with each semiconductor having a surface contacting the cold side 725 and an opposite surface contacting the hot side 730. In various implementations, the cold side 725 is a ceramic plate, while the hot side 730 is another ceramic plate. However, in other implementations, other materials may be used for the cold side 725 and the hot side 730. A voltage is applied to the surfaces of the semiconductors contacting the cold side 725 and to the surfaces of the semiconductors contacting the hot side 730, causing current to flow across the junctions of the different types of semiconductors that creates a temperature difference. The cold side 725 absorbs heat in response to the current flow, with the absorbed heat transported by the semiconductors to the hot side 730.

The hot side 730 of the thermoelectric cooler 720 is thermally coupled to a heat sink 735. Thus, the heat sink 735 is a heat spreader for transferring heat from the hot side 730 of the thermoelectric cooler 720 to an environment external to the camera module 700. In various embodiments, at least a portion of the heat sink 735 is external to the camera module 700 and exposed to an environment outside of the camera module 700, allowing heat from the heat sink 735 to be dissipated into the environment outside of the camera module 700. In other embodiments, each external surface of the heat sink 735 is exposed to the environment outside of the camera module to maximize a surface area of the heat sink 735 exposed to the environment outside of the camera module to increase heat dissipation into the environment outside of the camera module. In various embodiments, a thermal interface material (TIM) is between the hot side 730 of the thermoelectric cooler 720 and the heat sink 735 to increase thermal conductance between the hot side 730 of the thermoelectric cooler 720 and the heat sink 735. Examples thermal interface materials include: thermal paste, thermal adhesive, thermal gap filler, a thermally conductive pad, thermal tape, a phase change material, or metal. Insertion of a TIM between the heat sink 735 and the hot side 730 of the thermoelectric cooler 720 reduces thermal boundary resistance between the heat sink 735 and the hot side 730 of the thermoelectric cooler 720 to improve heat transfer between the hot side 725 of the thermoelectric cooler 720 and the heat sink 735.

The heat sink 735 is a thermally conductive material configured to transfer heat from the hot side 730 of the thermoelectric cooler 720 to an environment external to the camera module 700. Example thermally conductive materials used for the heat sink 735 include copper and aluminum. The heat sink 735 has an increased surface area relative to other components of the camera module 700 to maximize transfer of heat to the environment external to the camera module 700. In various implementations, the heat sink 735 includes multiple fins or pins external to the camera module 700 to maximize heat transfer into the environment external to the camera module 700.

In various implementations, such as the example shown in FIG. 7, the thermal plate 715 is enclosed by the heat sink 735 and is thermally insulated from the heat sink 735. The thermal plate 715 is also thermally insulated from the environment external to the camera module 700. For example, thermally insulating material is positioned between the thermal plate 715 and the heat sink 735 to prevent or to reduce heat transfer from the heat sink 735 to the thermal plate 715. For example, an area 750 between the thermal plate 715 and the heat sink 735 is filled with a thermally insulating material to reduce heat transfer from the heat sink 735 to the thermal plate 715, allowing the thermal plate 715 to more efficiently absorb heat generated by the image sensor 705. In various implementations, the image sensor 705, the first temperature sensor 710, the thermal plate 715, and the cold side 725 of the thermoelectric cooler 720 are thermally insulated from the heat sink 735. For example, an area 750 between each of the image sensor 705, the first temperature sensor 710, the thermal plate 715, and the cold side 725 of the thermoelectric cooler 720 is filled with a thermally insulating material. Such insulation of the image sensor 705, the thermal plate 715, and the cold side 725 of the thermoelectric cooler 720 prevents convection from affecting temperature of the image sensor 705, the thermal plate 715, and the cold side 725 of the thermoelectric cooler 720. For example, the insulation may reduce or eliminate effects from ambient temperature and thermal loads from heat sink 735 dissipated by means of convection and radiation.

A second temperature sensor 740 is configured to capture a temperature of the heat sink 735. In some implementations, the second temperature sensor 740 is coupled to the heat sink 735, while in other implementations the second temperature sensor 740 is proximate to the heat sink 735 but does not contact the image sensor 705. Various types of temperature sensor may be used for the second temperature sensor 740 in different embodiments. Example types of temperature sensor include: a thermocouple, a resistance temperature detector, a thermistor, a temperature sensor integrated circuit, an infrared temperature sensor, or other types of temperature sensor. In various embodiments, the second temperature sensor 740 is coupled to the heat sink 735. For example, the second temperature sensor 740 is a thermocouple directly coupled to a surface of the heat sink 735. In some embodiments, the second temperature sensor 740 is coupled to a surface of the heat sink 735 that is exposed to an environment external to the camera module 700. The second temperature sensor 740 is coupled to a controller, which is further described below in conjunction with FIG. 10.

In various implementations, the camera module 700 includes a lens barrel 745 configured to enclose the image sensor 705. For example, the lens barrel 745 is configured to encase the image sensor 705 to shield the image sensor 705 from the environment external to the camera module 700. In various embodiments, a portion of the lens barrel 745 within the field of view of the image sensor 705 is transparent, translucent, opaque, filtered, or semi opaque, allowing the image sensor 705 to capture images of the environment external to the camera module 700. In some embodiments, the lens barrel 745 includes a lens barrel tip including a lens that is configured to direct image light from the environment external to the camera module 700 to the image sensor 705. In some embodiments where the lens barrel 745 includes a lens barrel tip, the lens barrel tip is at an end of the lens barrel that is opposite to an end of the lens barrel 745 nearest to the image sensor 705. Further, the lens barrel tip has an axis along a length of the lens barrel 745 that intersects a plane including the image sensor 705 in various embodiments; for example, the lens barrel tip has an axis along a length of the lens barrel 745 that is perpendicular to a plane including the image sensor 705, while in other examples the axis along the length of the lens barrel housing 745 intersects the plane including the image sensor 705 at other angles. In some examples, the axis along the length of the lens barrel 745 corresponds to an optical axis of a lens included in the lens barrel tip. In various embodiments, the lens is located on an opposite end of an axis as the image sensor 705, with the lens and the image sensor 705 being on opposite ends of the camera module 700 in some embodiments. The lens is a glass in various embodiments, with glass resistant to warping from heat of the camera module 700 and an ambient environment. In various embodiments, the lens barrel tip is configured to position a lens so the image sensor 705 is in a focal plane of the lens; for example, the lens barrel tip positions the lens so a center of the image sensor 705 (or another portion of the image sensor 705) is located at a focal point of the lens. One or more mounting tabs are included in a plane including the image sensor 705 and used to couple the lens barrel 745 to the heat sink 735 in various embodiments. In some embodiments, interior surfaces of the lens barrel 745 (those surfaces not exposed to the external environment) are black or another dark color to reduce potential reflection of light from the external environment by the interior surfaces of the lens barrel 745 to the image sensor 705. Having interior surfaces of the lens barrel 745 black or a dark color allows the interior surfaces of the lens barrel 745 to absorb heat generated by the image sensor 705 through radiative heat transfer, where the lens barrel 745 absorbs at least a portion of infrared waves from the image sensor 705 corresponding to heat from the image sensor 705, such as heat generated by the image sensor 705 during operation. Further, a material or a combination of materials forming the lens barrel 745 has a rate of thermal expansion that reduces or minimizes an amount by which heating or cooling of the lens barrel 745 changes a focal plane of image light from the environment external to the camera module 700 from a lens and a plane including the image sensor 705 to reduce a focal shift from heating the lens barrel 745 relative to the image sensor 705, improving resolution of the image sensor 705 for a wider range of temperatures. In some implementations, a geometry of the lens barrel 745 also accounts for thermal expansion of the lens barrel 745, the focal plane of a lens included in the lens barrel 745, and the plane including the image sensor 705 to further reduce focal shift of the lens from thermal expansion or contraction of the lens barrel 745.

In various implementations, one or more portions of the lens barrel 745 are thermally coupled to one or more portions of the heat sink 735, with the lens barrel 745 configured to dissipate heat from the heat sink into the environment external to the camera module 700. Thermally coupling the lens barrel 745 to the heat sink 735 increases a surface area of the heat sink 735 by a surface area of the lens barrel 745, which increases dissipation of heat from the heat sink 735 to the environment external to the camera module 700. Such an implementation allows each of the external surfaces of the camera module 700—the external surfaces of the heat sink 735 and the external surfaces of the lens barrel 745—to dissipate heat, providing more efficient cooling of the image sensor 705. In various implementations, external surfaces of the lens barrel 745 are black to increase heat dissipation (or emission) of the external surfaces of the lens barrel 745. Further, external surfaces of the heat sink 735 are black in various embodiments to further increase heat dissipation (or emission) by the heat sink 735. This may result in increased heat dissipation.

In various embodiments, the thermal plate 715, the heat sink 735, and the lens barrel 745 comprise different materials, where a material comprising a component has a different rate of expansion when exposed to the environment external to the camera module 700. For example, the thermal plate 715, the heat sink 735, and the lens barrel 745 comprise different materials with different rates of thermal expansion. In various embodiments, the materials for different components are selected to minimize a difference between the rates of expansion of the different materials. For example, a combination of materials comprising the thermal plate 715, the heat sink 735, and the lens barrel 745 are selected so a difference between the rates of expansion for the different materials as close to zero as possible. Such a selection of materials for different components of the camera module minimizes angular shift in an image captured by the image sensor 705 from environmental conditions surrounding the camera module 700 (e.g., from heating or cooling of the environment external to the camera module 700).

Figure 8:
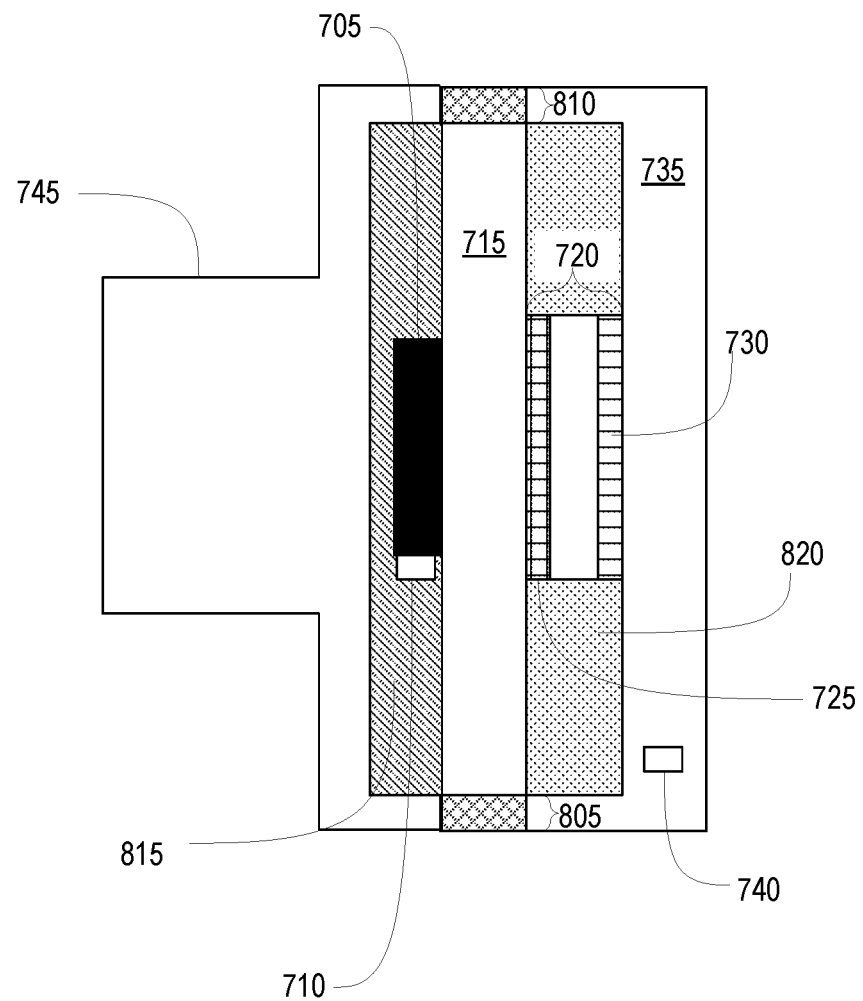
FIG. 8 is a cross-section of a camera module for regulating temperature of an image sensor according to some embodiments of the present disclosure.

FIG. 8 is a cross-section of an alternative camera module 800 for regulating temperature of an image sensor 705 according to some embodiments of the present disclosure. The camera module 800 shown in FIG. 8 includes an image sensor 705 coupled to a thermal plate 715, as further described above in conjunction with FIG. 7. Similarly, a first temperature sensor 710 is configured to capture a temperature of the image sensor 705, as further described above in conjunction with FIG. 7. In the camera module 800 of FIG. 8, the thermal plate 715 is thermally coupled to a cold side 725 of a thermoelectric cooler 720, with a hot side 730 of the thermoelectric cooler 720 coupled to a heat sink 735, as further described above in conjunction with FIG. 7. A second temperature sensor 740 is configured to capture a temperature of the heat sink 735, as further described above in conjunction with FIG. 7.

Unlike the camera module 700 further described above in conjunction with FIG. 7, the camera module 800 shown in FIG. 8 has a portion 805 of the thermal plate 715 that is thermally coupled to a portion of the heat sink 735 and an additional portion 810 of the thermal plate 715 that is thermally coupled to an additional portion of the heat sink 735. In various implementations, the portion of the heat sink 735 is physically coupled to the portion 805 of the thermal plate 715 and the additional portion of the heat sink 735 is physically coupled to the additional portion 810 of the thermal plate 715. While the camera module 800 shown in FIG. 8 increases a size of the thermal plate 715 relative to a size of the thermal plate 715 in the camera module 700 shown in FIG. 8, the camera module 800 shown in FIG. 8 exposes the portion 805 of the thermal plate 715 and the additional portion 810 of the thermal plate 715 to the environment outside of the camera module 800 as well as to the heat sink 735, decreasing effectiveness of the thermal plate 715 in absorbing heat from the sensor 705.

In various embodiments, a lens barrel 745 is configured to enclose the image sensor 705. For example, the lens barrel 745 is configured to encase the image sensor 705 to shield the image sensor 705 from the environment external to the camera module 800. The lens barrel 745 is configured to be physically separated from the image sensor 705 and from portions of the thermal plate 715 other than the portion 805 of the thermal plate 715 and the additional portion 810 of the thermal plate 715. Hence, a portion of the lens barrel 745 is coupled to the portion 805 of the thermal plate 715 and an additional portion of the lens barrel 745 is coupled to the additional portion 810 of the thermal plate 715. Other portions of the thermal plate 715 do not contact the lens barrel 745 and the lens barrel does not contact the image sensor 705, resulting in an area 815 between the lens barrel 745 and remaining portions of the thermal plate 715 and between the lens barrel 745 and the image sensor 705. In various embodiments, the area 815 is filled with a thermally insulating material to reduce heat transfer from the lens barrel 745 to the thermal plate 715 and to thermally insulate the portions of the thermal plate 715 other than portion 805 and portion 810 from the environment external to the camera module 800. In various embodiments, an area 820 between the thermal plate 715 and the heat sink 735 is filled with a thermally insulating material to reduce heat transfer from the heat sink 735 to the thermal plate 715, allowing the thermal plate 715 to more efficiently absorb heat generated by the image sensor 705. Different thermally insulating materials may be used to fill the area 815 between the lens barrel 745 and the thermal plate 715 and the area 820 between the thermal plate 715 and the heat sink 735 in some embodiments, while a common thermally insulating material fills both the area 815 between the lens barrel 745 and the thermal plate 715 and the area 820 between the thermal plate 715 and the heat sink 735 in other embodiments. Further, one of the area 815 between the lens barrel 745 and the thermal plate 715 and the area 820 between the thermal plate 715 and the heat sink 735 is filled with thermally insulating material while the other remains unfilled in some embodiments.

As further described above in conjunction with FIG. 7, in various embodiments the lens barrel 745 is a lens holder including a lens that is configured to direct image light from the environment external to the camera module 700 to the image sensor 705. In various embodiments, the lens barrel tip is configured to position a lens so the image sensor 705 is in a focal plane of the lens, as further described above in conjunction with FIG. 7. In various embodiments, exterior surfaces of the lens barrel 745 are black, allowing the exterior surfaces of the lens barrel to dissipate heat from the heat sink 735 that is directed to the lens barrel 745 from the heat sink 735 via the portion 805 of the thermal plate 715 and the additional portion 810 of the thermal plate 715 coupled to the heat sink 735 and to the lens barrel 745.

Figure 9:
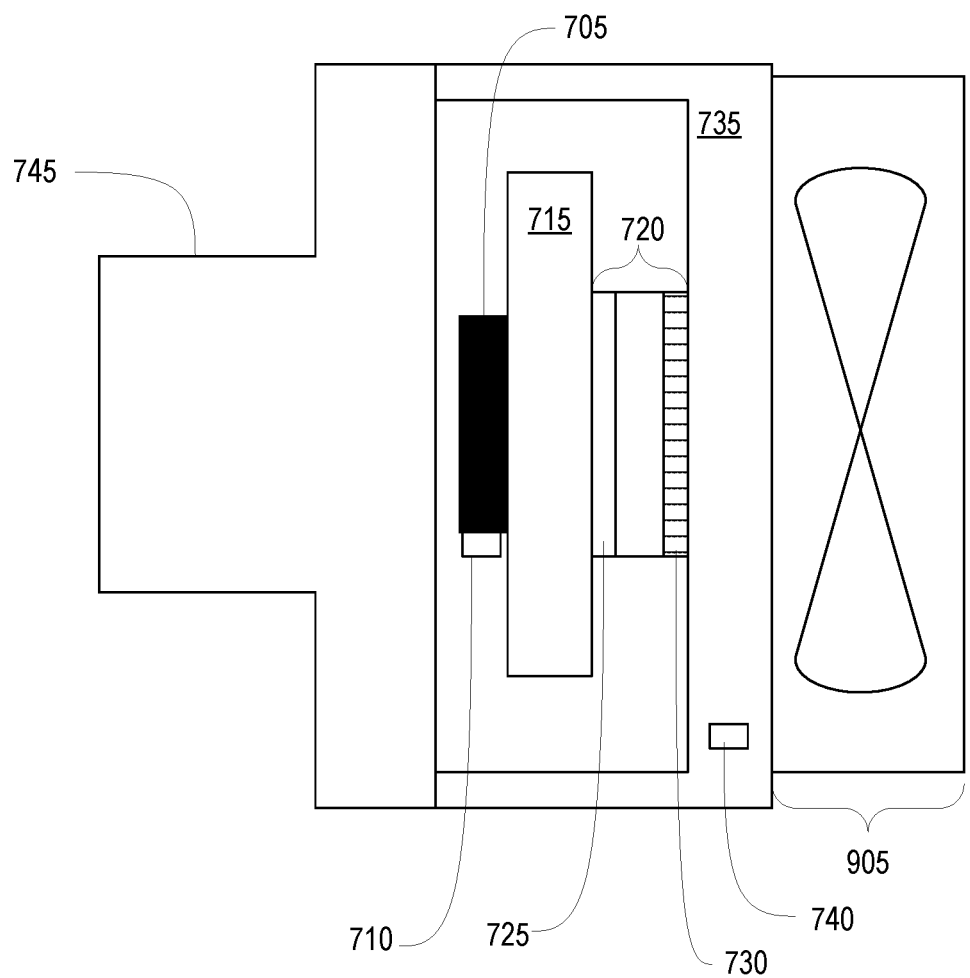
FIG. 9 is a cross-section of a camera module for regulating temperature an image sensor including a fan according to some embodiments of the present disclosure.

FIG. 9 is a cross-section of a camera module 900 for regulating temperature of an image sensor 705 including a fan 905 according to some embodiments of the present disclosure. The camera module 900 shown in FIG. 9 includes an image sensor 705 coupled to a thermal plate 715, as further described above in conjunction with FIG. 7. Similarly, a first temperature sensor 710 is configured to capture a temperature of the image sensor 705, as further described above in conjunction with FIG. 7. In the camera module 900 of FIG. 9, the thermal plate 715 is thermally coupled to a cold side 725 of a thermoelectric cooler 720, with a hot side 730 of the thermoelectric cooler 720 coupled to a heat sink 735, as further described above in conjunction with FIG. 7. A second temperature sensor 740 is configured to capture a temperature of the heat sink 735, as further described above in conjunction with FIG. 7.

The camera module 900 shown in FIG. 9 further includes a fan 905 coupled to the heat sink 735. In various embodiments, the fan 905 is coupled to a surface of the heat sink 735 that is exposed to the environment external to the camera module 700. The fan 905 is configured to produce airflow across the surface of the heat sink 735 exposed to the environment external to the camera module 700 in response to receiving one or more fan control signals to increase the heat transfer rate from the heat sink 735 to the environment external to the camera module 700, allowing the heat sink 735 to more efficiently dissipate heat from the hot side 730 of the thermoelectric cooler 720.

Operation of the fan 905 is determined by one or more fan control signals the fan 905 receives from a controller, or from a fan controller, as further described below in conjunction with FIG. 10. For example, a fan control signal is an activation signal, where the fan 905 is activated and moves air across the heat sink 735 in response to the activation signal having a first value. In various embodiments, the activation signal has the first value to activate the fan in response to a controller or a fan controller determining the thermoelectric cooler 720 is unable to provide sufficient cooling for the image sensor 705; this prevents the fan 905 from being activated unless the thermoelectric cooler 720 is unable to cool the image sensor 705 to a stored temperature for the image sensor 705 without the forced convection heat transfer between the heat sink 735 to the environment external to the camera module from airflow across the heat sink 735 caused by the fan 905. In various embodiments, a controller, such as further described below in conjunction with FIG. 10, accounts for an ambient temperature of the environment external to the camera module, a temperature of the image sensor 705, and a temperature of the heat sink 735 to determine whether the thermoelectric cooler 720 is able to cool the image sensor 705 to the stored temperature for the image sensor 705 without operating the fan 905, allowing the controller to limit conditions when the fan 905 is operated. In response to the activation signal having a second value, the fan 905 is deactivated and stops moving air across the heat sink 735. As another example, a fan control signal includes an indication of a speed for the fan 905 to rotate, allowing the fan control signal to adjust a rate at which air is directed across the heat sink 735 by the fan 905 using the fan control signal to increase or to decrease heat dissipation from airflow across the heat sink 735

In an embodiment, the fan 905 is coupled to one or more sensors that diagnose operation of the fan 905. For example, the fan is coupled to a tachometer that determines a rotation speed of the fan 905. Data from the tachometer, or other sensor, is provided to the controller or to a fan controller. The fan controller or the controller determines whether the rotation speed of the fan 905 satisfies one or more criteria. For example, the controller or the fan controller determines whether the rotation speed of the fan is within a threshold speed of a speed corresponding to a control signal supplied to the fan or whether the rotation speed of the fan is greater than the threshold speed of the speed corresponding to the control signal supplied to the fan. In other examples, data from the tachometer or other sensor coupled to the fan allows the controller or the fan controller to determine whether the fan is broken or whether the fan 905 is capable of receiving another control signal to have an increased rotation speed to provide larger airflow. Other determinations or signals may be generated by the controller or by the fan controller based on data from one or more sensors coupled to the fan in various embodiments.

Figure 10:
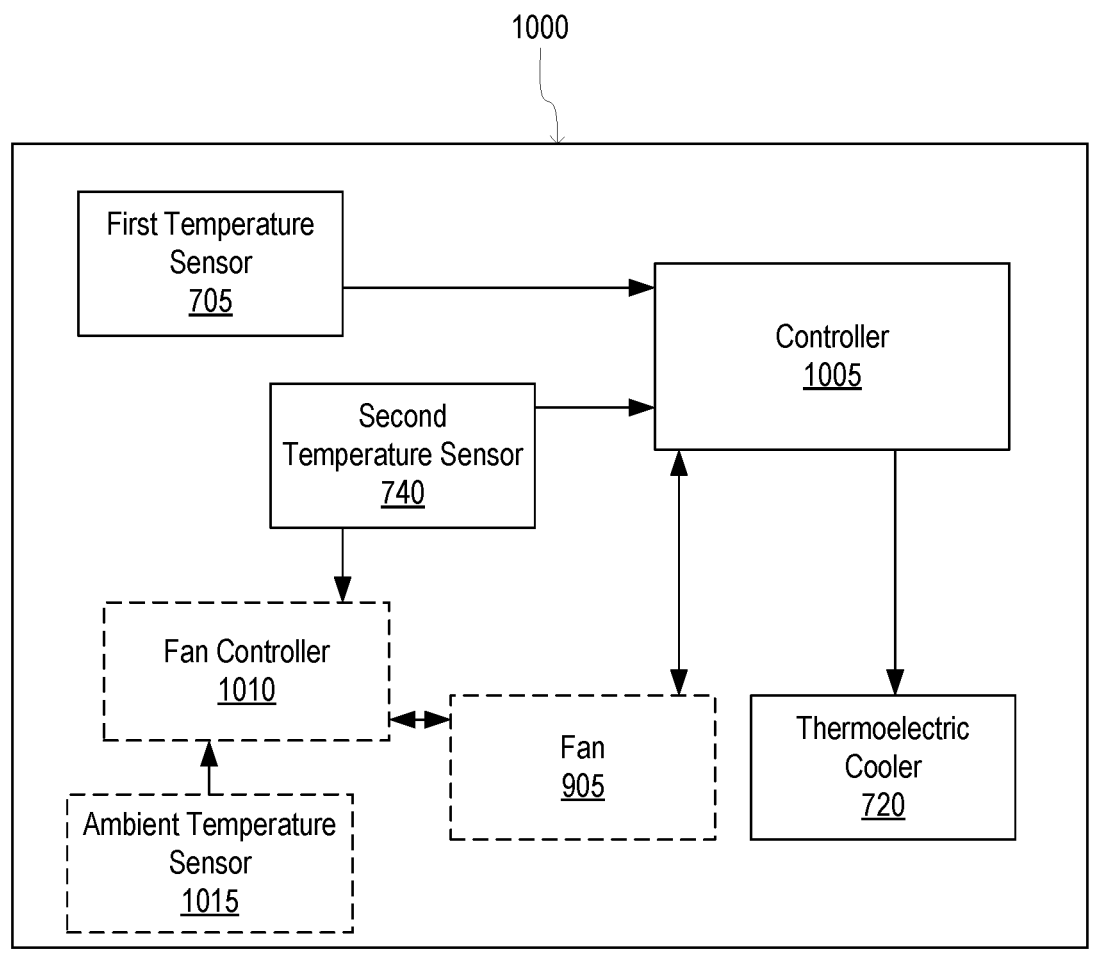
FIG. 10 is a block diagram of a system for regulating temperature of an image sensor according to some embodiments of the present disclosure.

FIG. 10 is a block diagram of a system 1000 for regulating temperature of an image sensor 705 according to some embodiments of the present disclosure. For purposes of illustration, FIG. 10 shows the system 1000 including the first temperature sensor 710, the second temperature sensor 740, the thermoelectric cooler 720, and a controller 1005. In some embodiments, the system 1000 also includes the fan 905 and a fan controller 1010. Further, the controller 1005 provides functionality further described below for the fan controller 1010 in some embodiments.

As further described above in conjunction with FIG. 7, the first temperature sensor 710 captures a temperature of the image sensor 705. The first temperature sensor 710 is also coupled to the controller 1005, which receives the temperature of the image sensor 705 from the first temperature sensor 710. In various embodiments, the controller 1005 includes one or more processors and a memory. One or more temperatures for the image sensor 705 are stored in the memory of the controller 1005. For example, the controller 1005 includes a maximum temperature for the image sensor 705 and a minimum temperature for the image sensor 705, allowing the controller 1005 to specify a range of operating temperatures for the image sensor 705 between the maximum temperature and the minimum temperature. In different embodiments, the one or more temperatures stored temperatures for the image sensor 705 depend on a type or on one or more characteristics of the image sensor 705, allowing different temperatures to be stored for different image sensors 705. For example, stored temperatures for an image sensor 705 specify a range of 0 degrees Celsius to 60 degrees Celsius for the image sensor 705.

The controller 1005 generates one or more control signals for the thermoelectric cooler 720 based on a comparison of the temperature of the image sensor 705 from the first temperature sensor 710 to one or more stored temperatures for the image sensor 705. A control signal adjusts transfer of heat between the cold side 725 of the thermoelectric cooler 720 and the hot side 730 of the thermoelectric cooler. In some embodiments, the controller 1005 generates a control signal that increases heat transfer from the cold side 725 of the thermoelectric cooler 720 to the hot side 730 of the thermoelectric cooler in response to the temperature of the image sensor 705 exceeding a maximum temperature stored for the image sensor 705. The control signal adjusts a voltage or a current the thermoelectric cooler 720 receives from a power source increases current flowing across the junctions of the different types of semiconductors comprising the thermoelectric cooler 720 to increase a temperature difference so the cold side 725 absorbs an increased amount of heat from the thermal plate 715 that is transported by the semiconductors of the thermoelectric cooler 720 to the hot side 730 of the thermoelectric cooler. The controller 1005 transmits the control signal to the thermoelectric cooler 720.

Additionally, an alternative control signal generated by the controller 1005 configures the thermoelectric cooler 720 to transport heat from the hot side 730 of the thermoelectric cooler 720 to the cold side 725 of the thermoelectric cooler 720, where the thermal plate 715 transfers the heat to the image sensor 705 through conductive heat transfer. This allows the thermoelectric cooler 720 to heat the image sensor 705 in certain situations. For example, in response to the controller 1005 determining a temperature of the image sensor 705 is less than a minimum temperature stored for the image sensor 705, the controller 1005 generates the alternative control signal and transmits the alternative control signal to the thermoelectric cooler 720. In various embodiments, the alternative control signal has polarity that is opposite to a polarity of the control signal previously described. For example, the alternative control signal applies a voltage to the thermoelectric cooler 720 having an opposite polarity than a voltage applied to the thermoelectric cooler 720 by the control signal. In another example, the alternative control signal applies a current to the thermoelectric cooler 720 having an opposite polarity than a current applied to the thermoelectric cooler 720 by the control signal. Hence, the alternative control signal adjusts a voltage or a current the thermoelectric cooler 720 receives from a power source to flow in through the junctions of the different types of semiconductors comprising the thermoelectric cooler 720 in a direction that causes a temperature difference between the cold side 725 of the thermoelectric cooler 720 and the hot side 730 of the thermoelectric cooler 720 so the hot side 730 absorbs heat from the heat sink 735, and the heat absorbed by the hot side 730 is transported by the semiconductors of the thermoelectric cooler 720 to the cold side 725 of the thermoelectric cooler 720. The thermal plate 715 transfers the heat from the cold side 725 of the thermoelectric cooler 720 to the image sensor 705 to increase a temperature of the image sensor 705. The controller 1005 accounts for a temperature of the image sensor 705 when determining whether to generate the alternative control signal that configures the thermoelectric cooler 720 to transport heat from the hot side 730 of the thermoelectric cooler 720 to the cold side 725 of the thermoelectric cooler 720. As operation of the image sensor 705 generates heat, the controller 1005 determines whether operation of the image sensor 705 generates an amount of heat that would cause the temperature of the image sensor 705 to reach the minimum temperature stored for the image sensor 705 within a threshold amount of time, based on operating characteristics of the image sensor 705, a temperature of the image sensor 705, and a temperature of the environment external to the camera module in some embodiments. In response to determining operation of the image sensor 705 generates an amount of heat that would cause the temperature of the image sensor 705 to reach the minimum temperature stored for the image sensor 705 within the threshold amount of time, the controller 1005 does not generate the alternative control signal in some embodiments. However, in response to determining operation of the image sensor 705 generates an amount of heat that would not cause the temperature of the image sensor 705 to reach the minimum temperature stored for the image sensor 705 within the threshold amount of time, the controller 1005 generate the alternative control signal and transmits the alternative control signal to the thermoelectric cooler 720.

In some embodiments, the controller 1005 stores a specific temperature for the image sensor 705 and generates control signals based on a comparison between the temperature of the image sensor 705 from the first temperature sensor 710 and the specific temperature. In response to the temperature of the image sensor 705 exceeding the specific temperature, the controller 1005 generates the control signal, as further described above, to increase an amount of heat from the image sensor 705 that is transferred from the image sensor 705 to the heat sink 735 through the thermal plate 715 and the thermoelectric cooler 720. Similarly, in response to the temperature of the image sensor 705 being less than the specific temperature, the controller 1005 generates the alternative control signal to transfer heat from the heat sink 735 to the image sensor 705 via the thermoelectric cooler 720 and the thermal plate 715. Hence, the controller 1005 is configured to maintain the specific temperature for the image sensor 705 in some embodiments.

When generating the control signal or the alternative control signal, in various implementations the controller 1005 accounts for a temperature of the heat sink 735 received from the second temperature sensor 740 coupled to the controller 1005. The temperature of the image sensor 705 and the temperature of the heat sink 735 allow the controller 1005 to determine a temperature difference between the cold side 725 of the thermoelectric cooler 720 and the hot side of the thermoelectric cooler 720. The controller 1005 adjusts a value of the control signal or of the alternative control signal based on the determined temperature difference, allowing the controller 1005 to account for a difference in temperature between the hot side 730 of the thermoelectric cooler 720 and the cold side 725 of the thermoelectric cooler 720 when adjusting heat transfer by the thermoelectric cooler 720.

In various embodiments, the controller 1005 is coupled to a power supply and uses pulse width modulation to vary the current or voltage the thermoelectric cooler 720 receives from the power supply when generating the one or more control signals. The controller 1005 determines pulse widths based on the difference between the temperature of the image sensor 705 and a stored temperature for the image sensor 705 in various embodiments, and accounts for a difference between a temperature of the cold side 725 of the thermoelectric cooler 720 and the hot side 730 of the thermoelectric cooler 720 in some embodiments. In embodiments where the camera module and the controller 1005 are included in an autonomous vehicle 100, the power supply is a battery of the autonomous vehicle 100. In some embodiments, the battery of the autonomous vehicle 100, or other power supply, is coupled to a regulator, which reduces the voltage of the battery or other power supply to a lower voltage that is input to the controller 1005.

In some embodiments, the system 1000 includes a fan controller 1010 coupled to the fan 905 and to the second temperature sensor 740. The fan controller 1010 generates one or more fan control signals that are transmitted to the fan 905 to modify operation of the fan 905. For example, the fan controller 1010 generates one or more fan control signals based on the temperature of the heat sink 735 received from the second temperature sensor 740. A fan control signal is an activation signal having a first value to activate the fan 905 and a second value to deactivate the fan 905. In various embodiments, the fan controller 1010 generates the activation signal having the first value in response to the temperature of the heat sink 735 equaling or exceeding a threshold temperature and transmits the activation signal to the fan 905. In various embodiments, the first value of the activation signal provides voltage from a power supply to the fan 905 to activate the fan. In response to the temperature of the heat sink 735 being less than the threshold temperature, the activation signal has the second value, which deactivates the fan 905 when received by the fan 905. For example, the second value of the activation signal halts voltage from a power supply to the fan 905.

The fan controller 1010 is coupled to an ambient temperature sensor 1015 in various embodiments. The ambient temperature sensor 1015 is configured to determine a temperature of the environment external to the camera module including the image sensor 705. In various embodiments, the fan controller 1010 generates the activation signal based on the temperature of the heat sink 735 and the temperature of the environment external to the camera module including the image sensor 705. For example, the fan controller 1010 determines a difference between the temperature of the heat sink 735 and the temperature of the environment external to the camera module including the image sensor 705 and generates the activation signal having the first value in response to the difference being less than a threshold value. Similarly, the fan controller 1010 generates the activation signal having the second value in response to the difference equaling or exceeding the threshold value. This allows the fan controller 1010 to account for an ambient temperature of the environment external to the camera module when determining whether to activate or to deactivate the fan 905, allowing the fan 905 to increase heat dissipation from the heat sink 735 when the temperature of the environment external to the camera module increases.

One or more of the fan control signals include an indication of a speed for the fan 905 to rotate when activated. In some embodiments, the indication is a specification of a specific rotation speed from a set of rotation speeds, allowing the indication to specify which speed of a set of speeds for the fan 905 to rotate. In other embodiments, the indication is a specific number of revolutions per minute or cubic feet per minute for the fan 905 to move across the heat sink 735. The fan controller 1010 determines the indication of the speed for the fan 905 based on the temperature of the heat sink 735 in various embodiments. For example, fan controller 1010 determines the speed of the fan 905 as directly related to the temperature of the heat sink 735, increasing the indication for the speed of the fan 905 as the temperature of the heat sink 735 increases (and decreasing the speed of the fan 905 as the temperature of the heat sink 735 decreases). In other embodiments, the fan controller 1010 determines the speed for the fan 905 based on a difference between the temperature of the heat sink 735 and a temperature of the environment external to the camera module from the ambient temperature sensor 1015. For example, the indication specifies a higher speed for the fan 905 when a difference between the temperature of the heat sink 735 and the temperature of the environment external to the camera module is smaller and specifies a lower speed for the fan 905 when the difference between the temperature of the heat sink 735 and the temperature of the environment external to the camera module is larger. In some embodiments, the fan controller 1010 transmits multiple fan control signals to the fan 905. For example, the fan controller 1010 transmits the activation signal and the indication of the speed of the fan 905, allowing the fan controller 1010 to regulate the speed of the fan 905 and whether the fan 905 is active.

While FIG. 10 shows an embodiment with the fan controller 1010 coupled to the fan 905, in other embodiments the controller 1005 provides the functionality of the fan controller 1010. In such embodiments, the controller 1005 is coupled to the fan 905, generates the one or more fan control signals, and transmits the one or more fan control signals to the fan 905. Further, where the controller 1005 provides the functionality of the fan controller 1010, the controller 1005 is coupled to the ambient temperature sensor 1015 in embodiments that include the ambient temperature sensor.

The controller 1005 is external to a camera module, such as the camera modules 700, 800, 900, further described above in conjunction with FIGS. 7-9, with the controller 1005 coupled to the thermoelectric cooler 720, to the first temperature sensor 710, and to the second temperature sensor 740. Similarly, in embodiments including a fan controller 1010, the fan controller 1010 is external to the camera module and coupled to the fan 905 and to the second temperature sensor 740. Having the controller 1005 external to the camera module reduces an amount of heat within the camera module by having heat generated by operation of the controller 1005 outside of the camera module; similarly, having the fan controller 1010 separate from the camera module reduces heat within the camera module by having heat generated from operation of the fan controller 1010 outside of the camera module.

Figure 11:
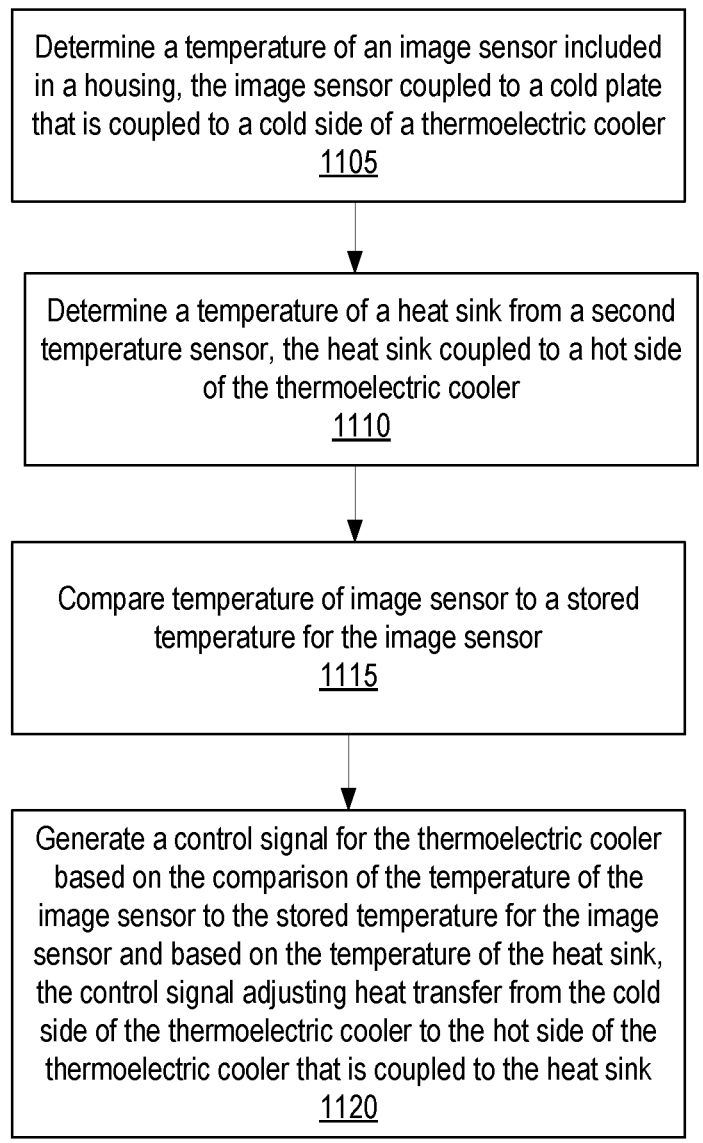
FIG. 11 is a flow chart of a method for regulating temperature of an image sensor according to some embodiments of the present disclosure.

For further illustration, FIG. 11 shows a flow chart of a method for regulating temperature of an image sensor 705 according to some embodiments of the present disclosure. The method of FIG. 11 may be performed, for example, in the controller 1005 further described above in conjunction with FIG. 10 in various embodiments.

The method shown in FIG. 11 includes determining 1105 a temperature of an image sensor 705 included in a camera module, such as the camera module 700, 800, 900 further described above in conjunction with FIGS. 7-8. In various embodiments, a first temperature sensor 710 captures the temperature of the image sensor 705. As further described above in conjunction with FIGS. 7-8, the image sensor 705 is coupled to a thermal plate 715 that is coupled to a cold side 725 of a thermoelectric cooler 720.

In the method shown in FIG. 11, a temperature of a heat sink 735 is determined 1110 from a second temperature sensor 740. As further described above in conjunction with FIG. 7, the second temperature sensor 740 is coupled to the heat sink 735 and determines 1110 the temperature of the heat sink 735 from conductive heat transfer between the heat sink 735 and the second temperature sensor 740 in some embodiments. For example, the second temperature sensor 740 is a thermocouple. In other embodiments, the second temperature sensor 740 is an infrared temperature sensor directed towards the heat sink 735 and determining 1110 the temperature of the heat sink 735 from infrared energy emitted by the heat sink 735.

The method further includes comparing 1115 the temperature of the image sensor 705 to a stored temperature for the image sensor 705. As further described above in conjunction with FIG. 10, the stored temperature for the image sensor 705 is a specific temperature at which the image sensor 705 operates in some embodiments. In other embodiments, a maximum temperature and a minimum temperature are stored for the image sensor 705, allowing an operating range of temperatures to be stored for the image sensor 705. In some embodiments, the stored temperature for the image sensor 705 is based on one or more characteristics of the image sensor 705, allowing different temperatures to be stored for different image sensors 705 in different embodiments.

A control signal for the thermoelectric cooler is generated 1120 based on the comparison of the temperature of the image sensor 705 to the stored temperature for the image sensor 705 and based on the temperature of the heat sink 735. The control signal adjusts transfer of heat between the cold side 725 of the thermoelectric cooler 720 and the hot side 730 of the thermoelectric cooler 720, with the hot side 730 of the thermoelectric cooler 720 coupled to a heat sink 735, as further described above in conjunction with FIGS. 7-9. In some embodiments, a control signal that increases heat transfer from the cold side 725 of the thermoelectric cooler 720 to the hot side 730 of the thermoelectric cooler 720 is generated in response to the temperature of the image sensor 705 exceeding a maximum temperature stored for the image sensor 705. Similarly, in some embodiments, an alternative control signal that increases heat transfer from the hot side 730 of the thermoelectric cooler 720 to the cold side 725 of the thermoelectric cooler 720 is generated in response to the temperature of the image sensor 705 being less than a minimum temperature stored for the image sensor 705. As further described above in conjunction with FIG. 10, in various embodiments, the control signal and the alternative control signal have opposite polarities, with a polarity corresponding to heat transfer from the cold side 725 of the thermoelectric cooler 720 to the hot side 730 of the thermoelectric cooler 720 and an opposite polarity corresponding to heat transfer from the hot side 730 of the thermoelectric cooler 720 to the cold side 725 of the thermoelectric cooler 720. As further described above in conjunction with FIG. 10, a value of a control signal is based on a difference between the temperature of the image sensor 705 and a temperature of the heat sink 735, allowing the value of the control signal to account for a temperature difference between the hot side 730 of the thermoelectric cooler 720 and the cold side 725 of the thermoelectric cooler 720. For example, the value of the control signal is based on a temperature difference between the temperature of the image sensor 705 and the temperature of the heat sink 735. The temperature of the image sensor 705 provides an indication of a temperature of cold side 725 of the thermoelectric cooler 720, while the temperature of the heat sink 735 provides an indication of a temperature of the hot side of the thermoelectric cooler 720. Additionally, the temperature of the heat sink 735 and the temperature of the image sensor 705 allow determination of power consumption by the thermoelectric cooler 720, allowing the value of the control signal to account for power consumed by the thermoelectric cooler 720.

In various embodiments, the method further includes generating one or more fan control signals for a fan 905 coupled to the heat sink 735 based on the temperature of the image sensor 705 and a temperature of the heat sink 735. As further described above in conjunction with FIGS. 9 and 9, the fan 905 is configured to produce airflow across the heat sink 735. Movement of air across the heat sink 735 via the fan 905 allows the heat sink 735 to more efficiently dissipate heat into an environment surrounding the heat sink 735. As further described above in conjunction with FIG. 10, in various embodiments, a fan control signal is an activation signal in which the fan 905 is activated in response to receiving the activation signal having a first value and is deactivated in response to receiving the activation signal having a second value. In some embodiments, the first value is a specific voltage from a power supply and the second value is zero voltage from the power supply. As another example, a fan control signal includes an indication of a speed at which the fan 905 rotates, allowing the fan control signal to adjust an amount of air flow across the heat sink 735 from the fan by adjusting a speed at which the fan rotates.

While FIGS. 7-11 describe inclusion of an image sensor 705 configured to capture image data in a camera module and cooling the image sensor 705 within the camera module, in other embodiments, different sensors may be included in the camera module and cooled using the camera module and the method further described above in conjunction with FIGS. 7-11. For example, a camera module further described above in conjunction with FIGS. 7-9 includes a lidar sensor configured to emit light pulses into an external environment and to capture reflections of the light pulses from objects in the external environment, with the lidar sensor coupled to the thermal plate 715 and cooled or heated via the thermoelectric cooler 720, as further described above in conjunction with FIGS. 7-11. However, other types of sensors are included in a camera module with a temperature of a sensor adjusted through the thermoelectric cooler 720 and the thermal plate 715, as further described above in conjunction with FIGS. 7-11.

Figure 12:
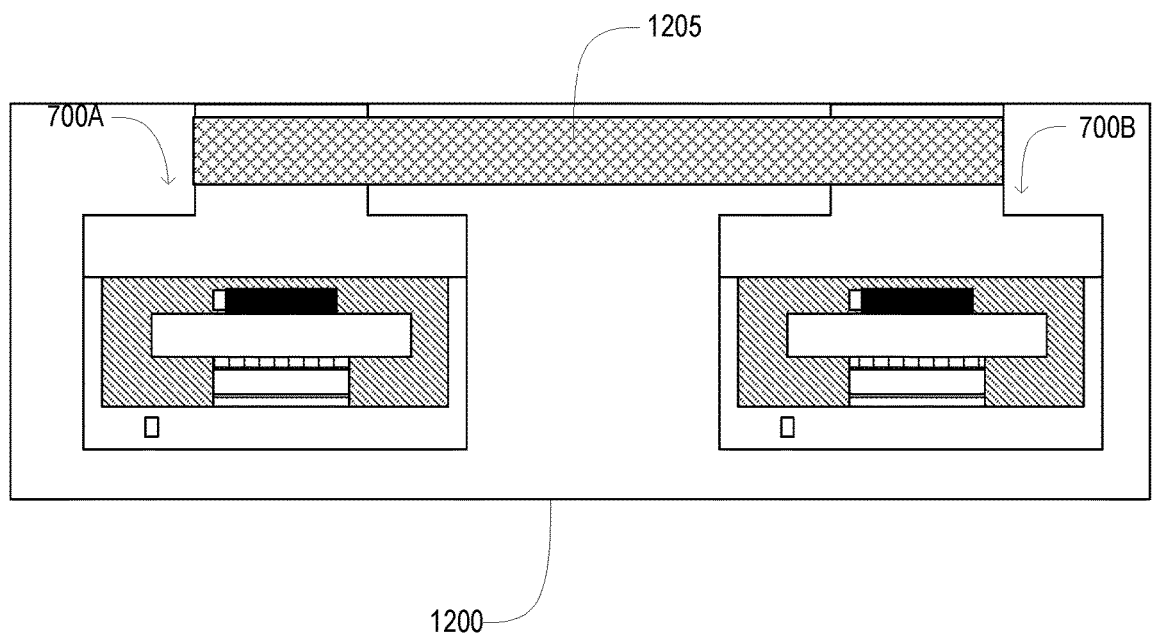
FIG. 12 is an overhead view of an enclosure including a plurality of camera modules and an optical bench according to some embodiments of the present disclosure.

Multiple camera modules, as described above in conjunction with FIGS. 7-11 are aligned relative to each other, with images captured by an image sensor 705 included in a first camera module compared to images captured by an image sensor 705 included in a second camera module. One or more stereoscopic vision methods are applied to the images captured by image sensors 705 in different camera modules to determine a distance between the camera modules and one or more objects in fields of view of the image sensors 705 of the camera modules. To mitigate effects of temperature changes on alignment of the camera modules relative to each other, FIG. 12 is an overhead view of an enclosure 1200 including a plurality of camera modules 700A, 700B. While FIG. 12 shows camera modules 700A, 700B included in the enclosure 1200 for purposes of illustration, in other embodiments, camera module 800 or camera module 900 is included in the enclosure 1200.

An optical bench 1205 is coupled to camera module 700A and to camera module 700B. In some embodiments, the optical bench 1205 is within the enclosure 1200, while in other embodiments, the optical bench 1205 forms an exterior surface of the enclosure 1200. The optical bench 1205 comprises a rigid or semi-rigid material. In various embodiments, the optical bench 1205 is a material that resists warping caused by temperature changes. For example, the optical bench 1205 is a material having a low coefficient of thermal expansion. In various embodiments, the optical bench 1205 comprises a different material than a material comprising the enclosure 1200 and has a lower coefficient of thermal expansion than the enclosure 1200. The optical bench 1205 maintains alignment between the camera module 700A and the camera module 700B, which maintains a relative position between the camera module 700A and the camera module 700B. This prevents mismatch between images captured by the image sensor 705 included in the camera module 700A and images captured by the image sensor 705 included in the camera module 700B. Such a reduction in mismatch between images from camera module 700A and from camera module 700B allows increased accuracy in determining depth from the enclosure 1200 to one or more objects included in the images captured by the image sensors 705 in camera module 700A and in camera module 700B.

In various embodiments, such as the embodiment shown by FIG. 11, each camera module 700A and camera module 700B include a lens barrel 745. As further described above in conjunction with FIG. 6, the lens barrel 745 is configured to enclose an image sensor 705 included in a camera module 700A, 700B. In some embodiments, the lens barrel 745 is thermally coupled to a heat sink 735 of a camera module 700A, 700B and is configured to dissipate heat from the heat sink 735. The optical bench 1205 is coupled to a portion of the lens barrel 745 of camera module 700A that is opposite to the heat sink 735 of camera module 700A. Similarly, the optical bench 1205 is coupled to a portion of the lens barrel 745 of camera module 700B that is opposite to the heat sink 735 of camera module 700B. As further described above in conjunction with FIG. 7, the lens barrel 745 encloses the image sensor 705. For example, the lens barrel 745 encases the image sensor 705 to shield the image sensor 705 from the environment external to the camera module 700. In various embodiments, a portion of the lens barrel 745 within the field of view of the image sensor 705 is transparent, translucent, opaque, filtered, or semi opaque, allowing the image sensor 705 to capture images of the environment external to the camera module 700. In some embodiments, the lens barrel 745 includes a lens barrel tip including a lens that is configured to direct image light from the environment external to the camera module 700 to the image sensor 705. For example, the lens barrel tip is at an end of the lens barrel that is opposite to an end of the lens barrel 745 nearest to the image sensor 705. Further, the lens barrel tip has an axis along a length of the lens barrel 745 that intersects a plane including the image sensor 705 in various embodiments; for example, the lens barrel tip has an axis along a length of the lens barrel 745 that is perpendicular to a plane including the image sensor 705, while in other examples the axis along the length of the lens barrel housing 745 intersects the plane including the image sensor 705 at other angles. In some examples, the axis along the length of the lens barrel 745 corresponds to an optical axis of a lens included in the lens barrel tip. In various embodiments, the lens is located on an opposite end of an axis as the image sensor 705, with the lens and the image sensor 705 being on opposite ends of the camera module 700 in some embodiments. The lens is a glass in various embodiments, with glass resistant to warping from heat of the camera module 700 and an ambient environment. In various embodiments, the lens barrel tip is configured to position a lens so the image sensor 705 is in a focal plane of the lens; for example, the lens barrel tip positions the lens so a center of the image sensor 705 (or another portion of the image sensor 705) is located at a focal point of the lens.

Coupling the optical bench 1205 to portions of the lens barrels 745 of camera module 700A and camera module 700B that are opposite to the respective heat sinks 735 of camera module 700A and camera module 700B reduce heat from the heat sinks 735 of the assemblies 745 that reaches the optical bench 1205. In various embodiments, the optical bench 1205 is coupled to a portion of the lens barrel 745 near a lens barrel tip. This positioning reduces a likelihood of the heat from the heat sink 735 of the camera module 700A or of the camera module 700B warping or deflecting a portion of the optical bench 1205. Further, this decreases the possibility that lenses of camera modules 700A and 700B shift in position relative to each other.

Further, in some embodiments, the lens barrel 745 of camera module 700A or of camera module 700B includes a lens barrel tip that encloses a lens configured to direct light to an image sensor included in camera module 700A or in camera module 700B, respectively. In such embodiments, the optical bench 1205 is coupled to a portion of the lens barrel tip of camera module 700A that is proximal to a lens included in the lens barrel tip of camera module 700A. Similarly, the optical bench 1205 is coupled to a portion of the lens barrel tip of camera module 700B that is proximal to a lens included in the lens barrel tip of camera module 700B. In various embodiments, the lens barrel tip positions the lens at an opposite end of the camera module 700B, 700B than an end of the camera module 700A, 700B including the heat sink 735. Hence, coupling the optical bench 1205 to portions of the lens barrel tip of camera module 700A and of the lens barrel tip of camera module 700B proximal to the lens maximizes a distance between where the optical bench 1205 is coupled to camera module 700A and to camera module 700B and the heat sinks of camera module 700A and of camera module 700B.

In some embodiments, a controller 1005, as further described above in conjunction with FIG. 10, is coupled to each camera module 700A, 700B. As further described above in conjunction with FIG. 10, a controller 1005 is coupled to the thermoelectric cooler 720 and to the first temperature sensor 710 of one of camera module 700A, 700B. In some embodiments, the controller 1005 is further coupled to the second temperature sensor 740. The controllers 1005 are within the enclosure 1200 in some embodiments, while in other embodiments the controllers 1005 are external to the enclosure 1200. In alternative embodiments, a first set of the controllers 1005 are within the enclosure 1200, while a second set of the controllers 1005 are external to the enclosure 1200.

Figure 13:
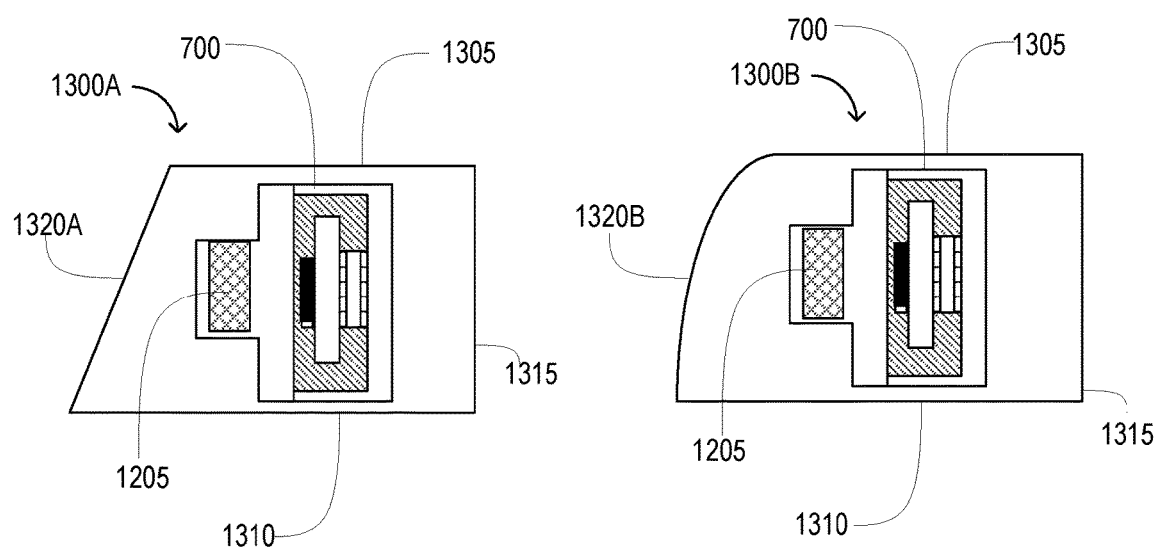
FIG. 13 is a side view of two example enclosures including a plurality of camera modules and an optical bench according to some embodiments of the present disclosure.

FIG. 13 is a side view of two example enclosures including a plurality of camera modules 700 and an optical bench 1205. In the examples shown by FIG. 13, enclosure 1300A and enclosure 1300B include a top surface 1305 and a bottom surface 1310 that is opposite to the top surface 1305. In some embodiments, the top surface 1305 is parallel to the bottom surface 1310, while in other embodiments the top surface 1305 is generally parallel to the bottom surface 1310. However, in additional embodiments, the top surface 1305 and the bottom surface 1310 have different orientations relative to each other. As shown in FIG. 13, the optical bench 1205 and a plurality of camera modules 700 are included in enclosure 1300A, 1300B.

In the examples shown by FIG. 13, a front end of the bottom surface 1310 extends beyond a front end of the top surface 1305 of enclosure 1300A. For example, a back surface 1315 couples the top surface 1305 of enclosure 1300A to the bottom surface 1310 of the enclosure 1300A at a back end of the top surface 1305 and at a back end of the bottom surface 1310. A distance from the front end of the bottom surface 1310 to the back surface 1315 is greater than a distance from the front end of the top surface 1305 to the back surface 1315. Having the bottom surface 1310 longer than the top surface 1305 allows the enclosure 1300A to be positioned in a broader range of locations. For example, having the front end of the bottom surface 1310 of the enclosure 1300A extend beyond the front end of the top surface 1305 of the enclosure 1300A allows the enclosure 1300A to be more easily positioned near a front window or windshield of a passenger compartment of an autonomous vehicle 100, such as the autonomous vehicle further described above in conjunction with FIGS. 1 and 2. Similarly, the front end of the bottom surface 1310 of enclosure 1300A extends beyond the front end of the top surface 1305 of enclosure 1300B in the examples shown by FIG. 12.

Enclosure 1300A has a front surface 1220A coupled to the front end of the bottom surface 1310 and coupled to the front end of the top surface 1305. In the example of enclosure 1300A, the front surface 1220A is a straight connection between the front end of the bottom surface 1310 and the front end of the top surface 1305. An angle with which the front surface 1220A is coupled to the front end of the bottom surface 1310 differs in different embodiments, allowing the front surface 1220A to be configured for different placement or different positioning of the enclosure 1300A. Enclosure 1300B has a front surface 1220B that is curved, while being coupled to the front end of the top surface 1305 and to the front end of the bottom surface 1310. The radius of the curve for the front surface 1220B in enclosure 1300B may be different in different embodiments, allowing the curve of the front surface 1220B to be modified for different configurations or placement of the enclosure 1300B.

In view of the explanations set forth above, including an image sensor in a camera module having a thermoelectric cooler allows a stable operating temperature to be maintained for the image sensor in environments subject to temperatures outside of a range of suitable operating temperatures for the image sensor. Such an ability to maintain a stable operating temperature for the image sensor prevents environmental heat from introducing thermal noise into images captured by the image sensor at higher temperatures, while preventing the image sensor from being affected by frost at lower temperatures. This allows an image sensor to be used in environments with wider temperature ranges, such as in a passenger compartment of an autonomous vehicle, providing a greater selection of image sensors for use in different environments. Thus, the camera module and controller further described herein provide a wider range of image sensors (e.g., a wider range of resolutions for image sensors). Additionally, using a thermoelectric cooler in the camera modules described herein allows the temperature of the image sensor to be regulated in a dry-air environment within the camera module to mitigate condensation on the image sensor or on the camera module, as the thermoelectric cooler does not use circulating refrigerant or water evaporation for cooling. Additionally, in embodiments where the camera module includes a lens configured to direct image light to the image sensor, the explanations set forth above improve accuracy of the image sensor across a wider range of temperatures by reducing shifts between a focal plane of the lens and the image sensor caused by changes in temperature of the camera module. Such reductions in shifts between the focal plane of the lens and the image sensor improve accuracies of systems such as the one described above in conjunction with FIG. 1, where pairs of cameras are matched to each other and reduction of a shift between the focal plane of the lens and the image sensor of a camera improves accuracy when comparing images captured by cameras in common pair.

Exemplary embodiments of the present disclosure are described largely in the context of a fully functional computer system for an autonomous vehicle. The present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others. Any computer system having suitable programming means will be capable of executing the steps of the method of the disclosure as embodied in a computer program product. Although some of the exemplary embodiments described in this specification are oriented to software installed and executing on computer hardware, nevertheless, alternative embodiments implemented as firmware or as hardware are well within the scope of the present disclosure.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein may be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood that any of the functionality or approaches set forth herein may be facilitated at least in part by artificial intelligence applications, including machine learning applications, big data analytics applications, deep learning, and other techniques. Applications of such techniques may include: machine and vehicular object detection, identification and avoidance; visual recognition, classification and tagging; algorithmic financial trading strategy performance management; simultaneous localization and mapping; predictive maintenance of high-value machinery; prevention against cyber security threats, expertise automation; image recognition and classification; question answering; robotics; text analytics (extraction, classification) and text generation and translation; and many others.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. An apparatus comprising:
    an enclosure including a plurality of camera modules, each camera module including:
        an image sensor configured to capture image data;
        a first temperature sensor configured to capture a temperature of the image sensor;
        a thermal plate thermally coupled to the image sensor;
        a thermoelectric cooler having a cold side thermally coupled to the thermal plate; and
        a heat sink thermally coupled to a hot side of the thermoelectric cooler, the hot side of the thermoelectric cooler opposite the cold side of the thermoelectric cooler;
    one or more controllers, a controller coupled to the thermoelectric cooler and to the first temperature sensor; and
    an optical bench coupled to each of the plurality of camera modules, the optical bench configured to maintain an alignment of each of the plurality of camera modules relative to each other.

2. The apparatus of claim 1, wherein each camera module further includes a lens barrel configured to enclose the image sensor, one or more portions of the lens barrel thermally coupled to one or more portions of the heat sink, the lens barrel configured to dissipate heat from the heat sink.

3. The apparatus of claim 2, wherein the optical bench is coupled to a portion of the lens barrel of a first camera module that is opposite to the heat sink of the first camera module and to a portion of the lens barrel of a second camera module that is opposite to the heat sink of the second camera module.

4. The apparatus of claim 2, wherein the lens barrel includes a lens barrel tip enclosing a lens configured to direct light to the image sensor.

5. The apparatus of claim 4, wherein the optical bench is coupled to a portion of the lens barrel tip of a first camera module proximal to the lens of the first camera module and is coupled to a portion of the lens barrel tip of a second camera module proximal to the lens of the second camera module.

6. The apparatus of claim 1, wherein the optical bench comprises a material that resists warping due to temperature changes.

7. The apparatus of claim 6, wherein the material comprising the optical bench comprises a different material than an enclosure material comprising the enclosure.

8. The apparatus of claim 1, wherein one or more dimensions of the thermal plate exceed one or more corresponding dimensions of the image sensor.

9. The apparatus of claim 1, wherein each camera module further includes a second temperature sensor configured to determine a temperature of the heat sink, the second temperature sensor coupled to a controller.

10. The apparatus of claim 9, wherein the second temperature sensor is coupled to a surface of the heat sink.

11. The apparatus of claim 10, wherein the surface of the heat sink is exposed to an environment external to the camera module.

12. The apparatus of claim 1, wherein the one or more controllers are within the enclosure.

13. The apparatus of claim 1, wherein the one or more controllers are external to the enclosure.

14. The apparatus of claim 1, wherein a first set of the one or more controllers are within the enclosure and a second set of the one or more controllers are external to the enclosure.

15. A system comprising:
    a camera module including:
        an image sensor configured to capture image data;
        a first temperature sensor thermally coupled to the image sensor and configured to capture a temperature of the image sensor;
        a thermal plate thermally coupled to the image sensor;
        a thermoelectric cooler having a cold side thermally coupled to the thermal plate;
        a heat sink thermally coupled to a hot side of the thermoelectric cooler, the hot side of the thermoelectric cooler opposite the cold side of the thermoelectric cooler;
        a second temperature sensor configured to capture a temperature of the heat sink; and
    a controller coupled to the thermoelectric cooler, to the first temperature sensor, and to the second temperature sensor.

16. The system of claim 15, further comprising:
    a fan coupled to the heat sink configured to receive one or more fan control signals and configured to produce airflow across the heat sink.

17. The system of claim 16, wherein a fan control signal comprises an activation signal, wherein the fan is activated in response to the activation signal having a first value and the fan is deactivated in response to the activation signal having a second value.

18. The system of claim 16, wherein the controller transmits the one or more fan control signals to the fan.

19. The system of claim 16, further comprising:
    a fan control module coupled to the fan, the fan control module configured to generate the one or more fan control signals based on the temperature of the heat sink and to transmit the one or more fan control signals to the fan.

20. The system of claim 15, further comprising:
    a lens barrel configured to enclose the image sensor, one or more portions of the lens barrel thermally coupled to one or more portions of the heat sink, the lens barrel configured to dissipate heat from the heat sink.

21. The system of claim 20, wherein the lens barrel comprises a lens barrel tip enclosing a lens configured to direct light to the image sensor.

22. The system of claim 15, wherein the thermal plate is enclosed by the heat sink and is thermally insulated from the heat sink.

23. The system of claim 15, wherein one or more portions of the thermal plate contact one or more portions of the heat sink.

24. The system of claim 23, further comprising:
    a lens holder configured to enclose the image sensor, one or more portions of the lens holder contacting the one or more portions of the thermal plate that contact the one or more portions of the heat sink.

25. The system of claim 15, wherein the image sensor, the first temperature sensor, the thermal plate, and the cold side of the thermoelectric cooler are thermally insulated from the heat sink.

26. The system of claim 15, wherein the controller is configured to:
- compare the temperature of the image sensor to a stored temperature for the image sensor; and
- transmit a control signal to the thermoelectric cooler based on the comparison, the control signal adjusting transfer of heat between the cold side of the thermoelectric cooler and the hot side of the thermoelectric cooler.

27. The system of claim 26, wherein the control signal to the thermoelectric cooler increases heat transfer from the cold side of the thermoelectric cooler to the hot side of the thermoelectric cooler in response to the temperature of the image sensor exceeding a maximum temperature stored by the controller for the image sensor.

28. The system of claim 26, wherein the control signal to the thermoelectric cooler transfers heat from the hot side of the thermoelectric cooler to the cold side of the thermoelectric cooler in response to the temperature of the image sensor being less than a minimum temperature stored by the controller for the image sensor.

29. The system of claim 15, wherein the first temperature sensor is coupled to a surface of the image sensor.

30. The system of claim 29, wherein the first temperature sensor is embedded within the image sensor.

31. The system of claim 15, wherein the second temperature sensor is coupled to a surface of the heat sink.

32. The system of claim 31, wherein the surface of the heat sink is exposed to an environment external to the camera module.

33. The system of claim 15, wherein the thermal plate is configured to conductively transfer heat between the image sensor and the thermoelectric cooler.

34. The system of claim 15, wherein one or more dimensions of the thermal plate exceed one or more corresponding dimensions of the image sensor.

35. The system of claim 34, wherein a length of the thermal plate is greater than a length of the image sensor.

36. The system of claim 34, wherein a width of the thermal plate is greater than a width of the image sensor.

37. A method comprising:
- determining a temperature of an image sensor included in a camera module from a first temperature sensor, the image sensor coupled to a thermal plate that is coupled to a cold side of a thermoelectric cooler;
- determining a temperature of a heat sink from a second temperature sensor, the heat sink coupled to a hot side of the thermoelectric cooler;
- comparing the temperature of the image sensor to a stored temperature for the image sensor; and
- generating a control signal for the thermoelectric cooler based on the comparison of the temperature of the image sensor to the stored temperature for the image sensor and the temperature of the heat sink, the control signal adjusting transfer of heat between the cold side of the thermoelectric cooler and the hot side of the thermoelectric cooler coupled to the heat sink.

38. The method of claim 37, wherein generating the control signal for the thermoelectric cooler based on the comparison of the temperature of the image sensor to the stored temperature for the image sensor and the temperature of the heat sink, the control signal adjusting transfer of heat between the cold side of the thermoelectric cooler and the hot side of the thermoelectric cooler coupled to the heat sink comprises:
- generating a control signal that increases heat transfer from the cold side of the thermoelectric cooler to the hot side of the thermoelectric cooler in response to the temperature of the image sensor exceeding a maximum temperature stored for the image sensor.

39. The method of claim 37, wherein generating the control signal for the thermoelectric cooler based on the comparison of the temperature of the image sensor to the stored temperature for the image sensor and the temperature of the heat sink, the control signal adjusting transfer of heat between the cold side of the thermoelectric cooler and the hot side of the thermoelectric cooler coupled to the heat sink comprises:
- generating an alternative control signal that increases heat transfer from the cold side of the thermoelectric cooler to the hot side of the thermoelectric cooler in response to the temperature of the image sensor being less than a minimum temperature stored for the image sensor.

40. The method of claim 37, further comprising:
- generating one or more fan control signals for a fan coupled to the heat sink based on the temperature of the image sensor and the temperature of the heat sink, the fan configured to produce airflow across the heat sink.

41. The method of claim 40, wherein a fan control signal comprises an activation signal, wherein the fan is activated in response to the activation signal having a first value and the fan is deactivated in response to the activation signal having a second value.

* * * * *